United States Patent
Nakagawa et al.

(10) Patent No.: US 9,634,580 B2
(45) Date of Patent: Apr. 25, 2017

(54) POWER CONVERTER CONTROLLER

(71) Applicant: DAIKIN INDUSTRIES, LTD., Osaka-shi, Osaka (JP)

(72) Inventors: Michihiro Nakagawa, Kusatsu (JP); Nobuki Kitano, Kusatsu (JP); Naoto Kobayashi, Kusatsu (JP)

(73) Assignee: DAIKIN INDUSTRIES, LTD., Osaka-shi (JP)

( * ) Notice: Subject to any disclaimer, the term of this patent is extended or adjusted under 35 U.S.C. 154(b) by 48 days.

(21) Appl. No.: 14/772,479

(22) PCT Filed: Mar. 4, 2014

(86) PCT No.: PCT/JP2014/055438
§ 371 (c)(1),
(2) Date: Sep. 3, 2015

(87) PCT Pub. No.: WO2014/136761
PCT Pub. Date: Sep. 12, 2014

(65) Prior Publication Data
US 2016/0020708 A1    Jan. 21, 2016

(30) Foreign Application Priority Data

Mar. 5, 2013 (JP) ................................ 2013-043011

(51) Int. Cl.
*H02M 7/537* (2006.01)
*H02M 7/539* (2006.01)
(Continued)

(52) U.S. Cl.
CPC ....... *H02M 7/539* (2013.01); *H02M 7/53875* (2013.01); *H02P 21/12* (2013.01);
(Continued)

(58) Field of Classification Search
CPC .. H02M 7/537; H02M 7/539; H02M 7/53875; H02M 2001/0009; H02M 2001/53878
(Continued)

(56) References Cited

U.S. PATENT DOCUMENTS 5,955,862 A    9/1999 Nguyen Phuoc
6,208,109 B1 *    3/2001 Yamai .................... H02P 6/10
                                                                318/430
(Continued)

FOREIGN PATENT DOCUMENTS

EP         1944860 A1    7/2008
JP         4-222466 A    8/1992
(Continued)

OTHER PUBLICATIONS

Daijyo et al., "On PWM Patterns and Harmonic Analysis of a General Purpose Inverter for Induction Motor Drives", the Institute of Electrical Engineers of Japan Transactions D, the Institute of Electrical Engineers of Japan, 1989, vol. 109, No. 11, pp. 809-816.
(Continued)

*Primary Examiner* — Adolf Berhane
*Assistant Examiner* — Nusrat Quddus
(74) *Attorney, Agent, or Firm* — Birch, Stewart, Kolasch & Birch, LLP

(57) ABSTRACT

A difference command generator generates a difference command equivalent to a time integral of three-phase voltage applied to an inductive load in a predetermined cycle in a complex plane. A vector command generator generates vector commands that are respectively time integrals of voltage vectors and compose the difference command. A switching signal generator generates switching signals for controlling three pairs of switches in an inverter on the basis of the vector commands. A phase-current computing unit obtains an estimated value for the three-phase current on the
(Continued)

basis of a current flowing DC buses and the vector commands. At least two of the vector commands that are time integrals of different ones of the non-zero voltage vectors have magnitudes greater than or equal to a predetermined value corresponding to a minimum required amount of time to maintain switching patterns in order for the phase-current computing unit to detect the current.

18 Claims, 22 Drawing Sheets

(51) Int. Cl.
| | | |
|---|---|---|
| *H02M 7/5387* | (2007.01) | |
| *H02P 27/12* | (2006.01) | |
| *H02P 21/30* | (2016.01) | |
| *H02P 21/12* | (2016.01) | |
| *H02M 1/00* | (2006.01) | |
| *G01R 19/00* | (2006.01) | |
| *G01R 31/42* | (2006.01) | |

(52) U.S. Cl.
CPC .............. *H02P 21/30* (2016.02); *H02P 27/12* (2013.01); *G01R 19/0092* (2013.01); *G01R 31/42* (2013.01); *H02M 2001/0009* (2013.01); *H02M 2007/53876* (2013.01)

(58) Field of Classification Search
USPC ...... 363/37, 40, 41, 55, 56.01, 56.02, 56.03, 363/56.04, 95–98, 131–132
See application file for complete search history.

(56) References Cited

U.S. PATENT DOCUMENTS

| | | | | |
|---|---|---|---|---|
| 2003/0048006 A1* | 3/2003 | Shelter, Jr. | .............. | H02J 9/061 307/64 |
| 2004/0131114 A1 | 7/2004 | Ishida et al. | | |
| 2006/0125437 A1* | 6/2006 | Kitano | .................... | F04B 35/04 318/432 |
| 2010/0194319 A1* | 8/2010 | Ito | ......................... | H02P 21/14 318/400.13 |
| 2011/0068722 A1 | 3/2011 | Wolf et al. | | |
| 2013/0221884 A1* | 8/2013 | Ashida | ................ | H02M 7/5395 318/400.13 |
| 2013/0278200 A1* | 10/2013 | Fujii | ....................... | H02P 6/002 318/722 |
| 2014/0084822 A1* | 3/2014 | Ito | .......................... | H02P 6/185 318/400.02 |
| 2014/0369089 A1* | 12/2014 | Sakakibara | ......... | H02M 5/4585 363/37 |
| 2015/0077025 A1* | 3/2015 | Suzuki | ................. | B62D 5/0463 318/400.02 |
| 2015/0236628 A1* | 8/2015 | Wang | .................. | H02M 7/5395 318/139 |

FOREIGN PATENT DOCUMENTS

| | | |
|---|---|---|
| JP | 7-170751 A | 7/1995 |
| JP | 11-4594 A | 1/1999 |
| JP | 3289281 B2 | 6/2002 |
| JP | 3664040 B2 | 6/2005 |
| JP | 4643404 B2 | 3/2011 |
| JP | 2011-234428 A | 11/2011 |

OTHER PUBLICATIONS

Daijyo et al., "On the Magnetic Noise of an Induction Motor Driven by PWM Inverter", the Institute of Electrical Engineers of Japan Transactions D, the Institute of Electrical Engineers of Japan, 1988, vol. 108, No. 3, pp. 237-244.

Ohyama et al., "A Novel Current Control Technique for Voltage Source Inverter in Field Oriented Control", the Institute of Electrical Engineers of Japan Transactions B, the Institute of Electrical Engineers of Japan, 1985, vol. 105, No. 11, pp. 901-908.

Xue et al., "A Stator Flux-Oriented Voltage Source Variable-Speed Drive Based on dc Link Measurement," IEEE Transactions on Industry Applications, vol. 27, No. 5, Sep./Oct. 1991, pp. 962-969.

* cited by examiner

F I G. 1
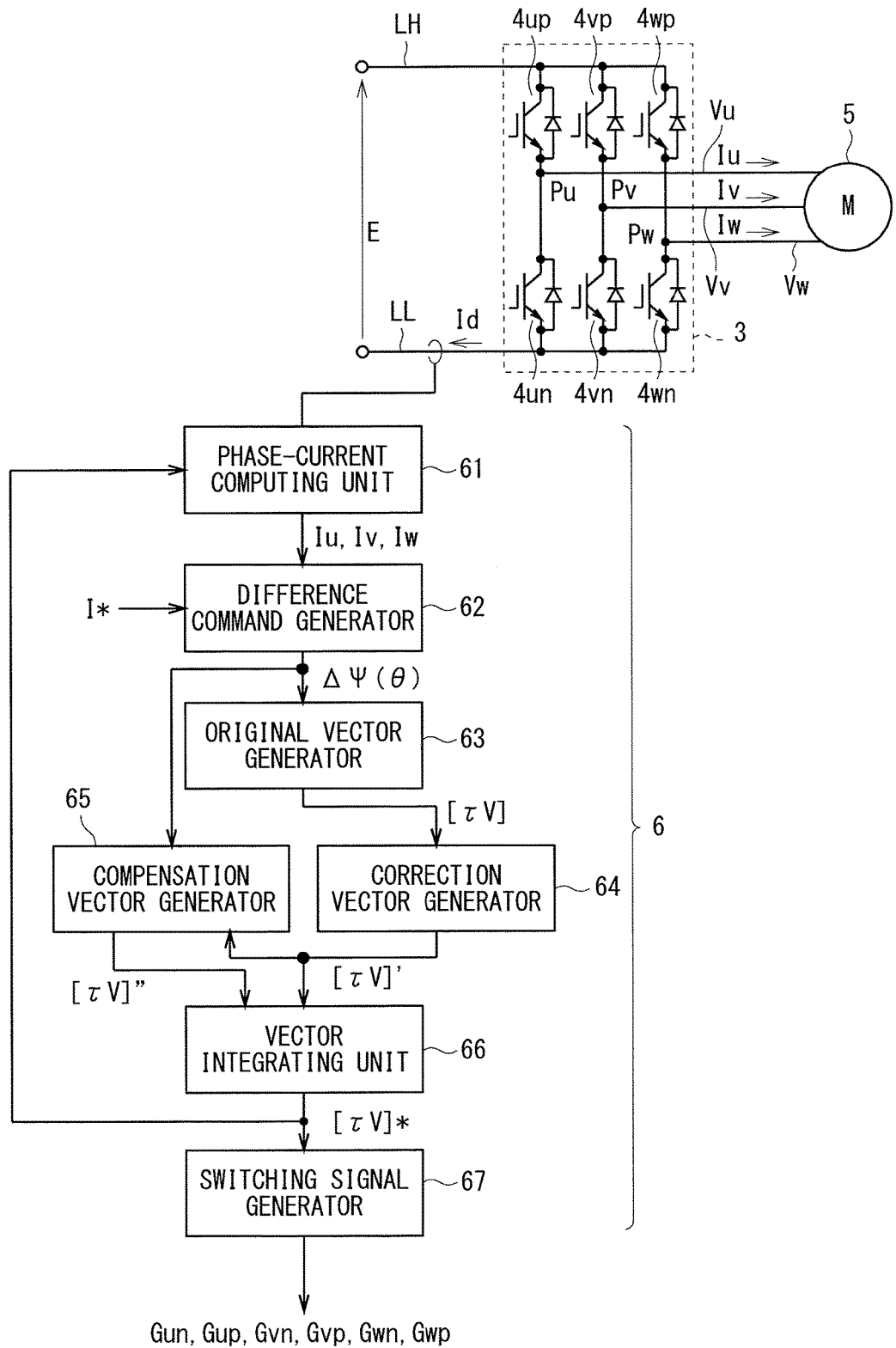

F I G. 2
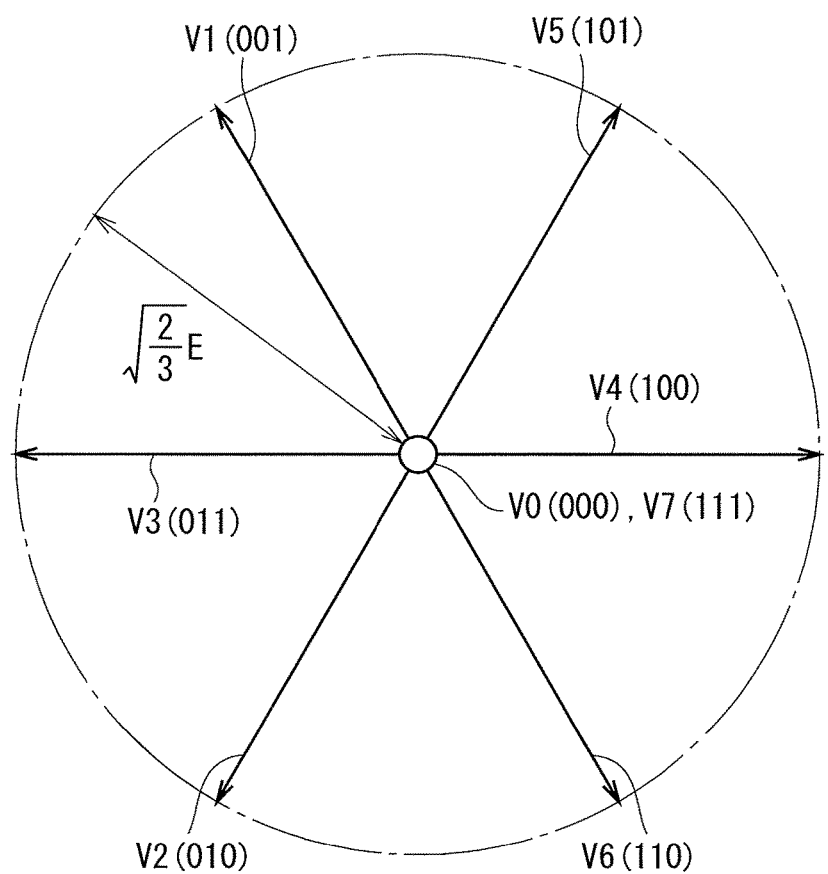

F I G. 4
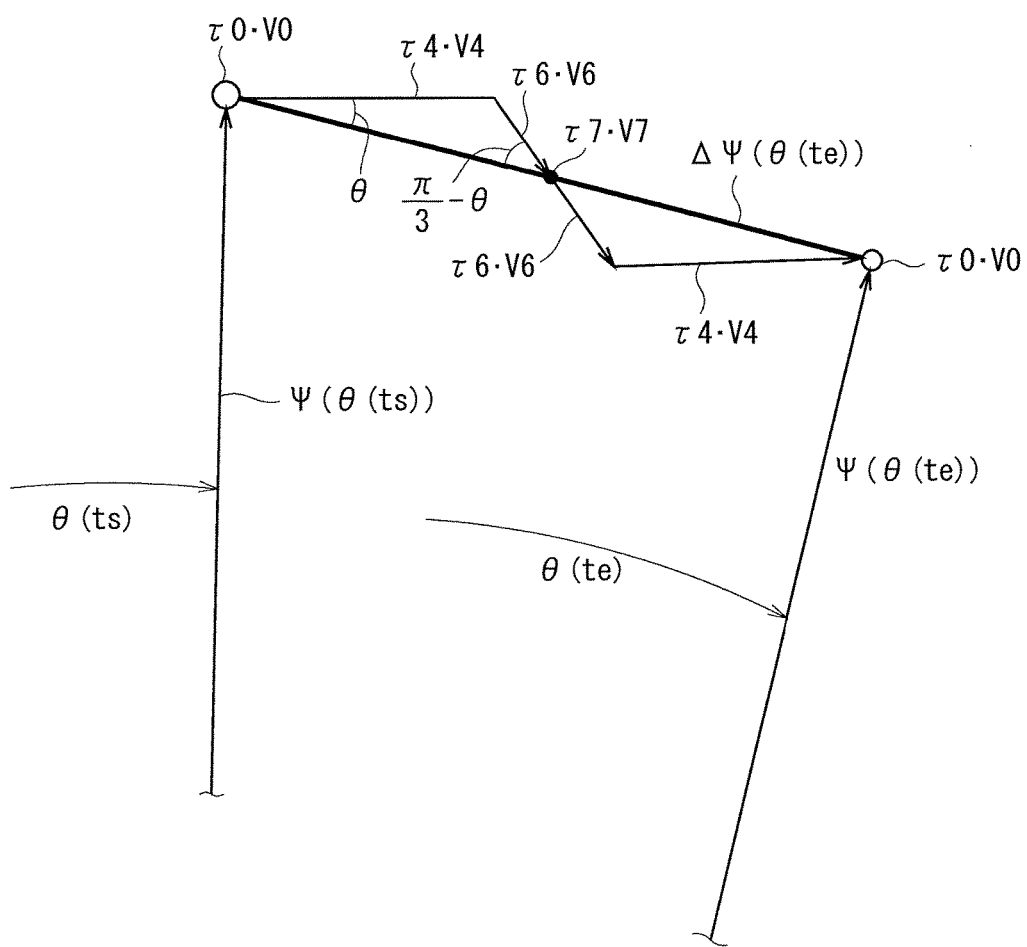

F I G. 1 4
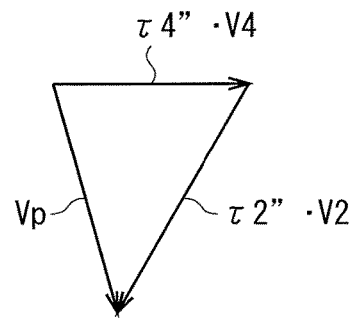
F I G. 1 5
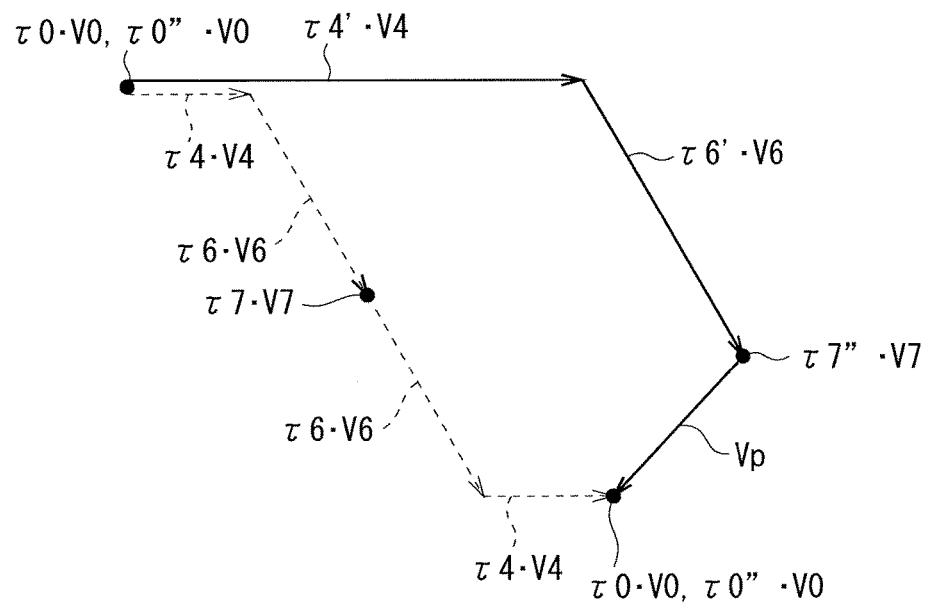

F I G. 3 1
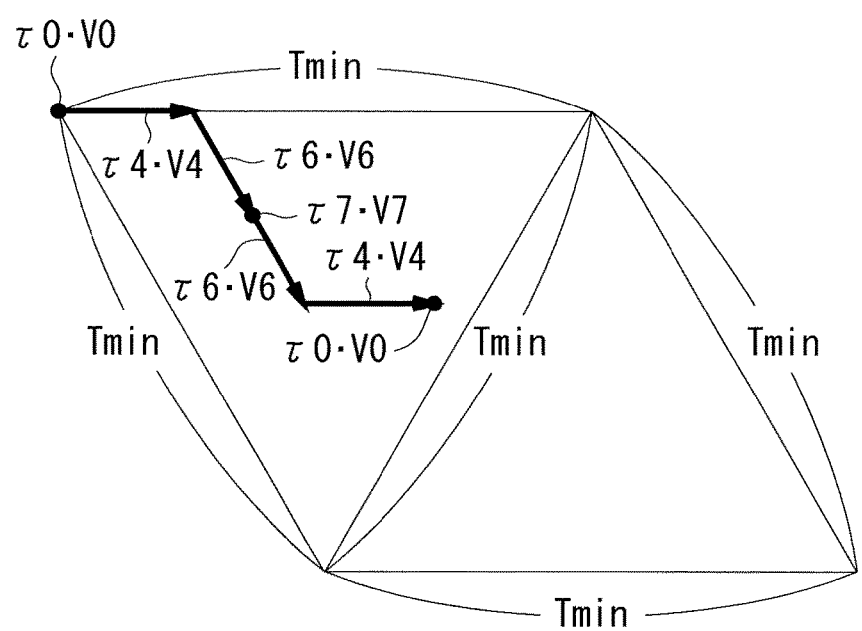

F I G. 3 8
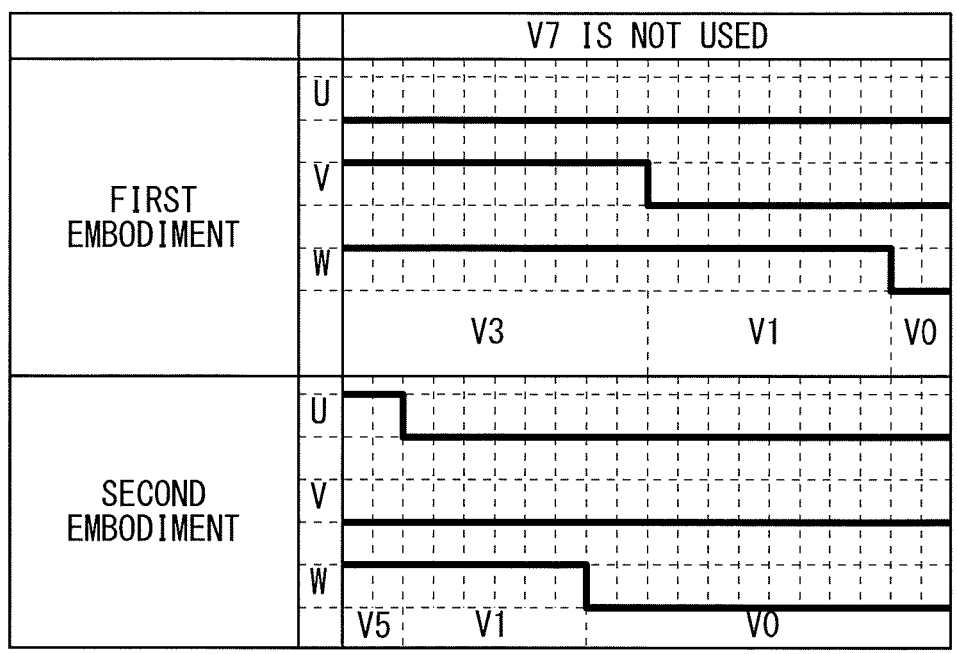

POWER CONVERTER CONTROLLER

TECHNICAL FIELD

The present technology relates to controlling a power converter, and, in particular, to technology for detecting current flowing through a power converter that converts three-phase alternating current into direct current.

BACKGROUND ART

As for an inverter that receives DC voltage and outputs three-phase AC voltage, technology for detecting line current of each phase flowing between the inverter and a load, and controlling operation of the load based on the line current is known.

Three-phase current flows between the inverter and the load, and thus, if line current of two phases is detected, line current of the other phase is determined unambiguously. At least two sensors each detecting line current are therefore usually necessary.

Use of a plurality of sensors, however, leads to high cost. To solve this problem, there is technology of providing a sensor to at least one of a pair of DC buses for supplying DC voltage to the inverter to detect current (hereinafter, referred to as "DC link current") flowing through the sensor as line current of one phase. Specifically, which phase of line current the DC link current corresponds to is determined by taking a switching pattern used by the inverter while the DC link current flows into consideration.

In this technology, in order to determine which phase of line current the DC link current corresponds to, one switching pattern has to be maintained for time required to detect the DC link current.

The DC link current is commutated in current paths in the inverter due to switching of the inverter, and then ringing is generated. There is turn-on time of a switching device for performing switching of the inverter. Time for A/D conversion is further required to handle values of the DC link current as data.

That is to say, time for which one switching pattern has to be maintained to associate the DC link current with line current of one phase has to be at least longer than the total time of time for ringing of the DC link current, time for A/D conversion, and time for turning-on of the switching device. Still another factor, such as dead time of switching, may have to be considered.

There is, therefore, a minimum amount of time required to maintain a switching pattern to measure the DC link current to detect it as line current. This value is hereinafter referred to as a minimum time limit.

A compulsory increase, solely, in time for which a switching pattern is used to obtain line current obviously causes distortion of output voltage of the inverter, and further causes distortion of line current output from the inverter.

The switching pattern of the inverter, especially a voltage source inverter, can be determined using a so-called method with a circular locus (or a circular approximation method). The method with a circular locus (hereinafter "the circular locus method") is well known from Japanese Patent No. 3289281 and Ohyama and four others, "A Novel Current Control Technique for Voltage Source Inverter in Field Oriented Control", the Institute of Electrical Engineers of Japan Transactions B, the Institute of Electrical Engineers of Japan, 1985, Vol. 105, No. 11, p. 901-908, Daijyo and three others, "On the Magnetic Noise of an Induction Motor Driven by PWM Inverter", the Institute of Electrical Engineers of Japan Transactions D, the Institute of Electrical Engineers of Japan, 1988, Vol. 108, No. 3, p. 237-244 and Daijyo and three others, "On PWM Patterns and Harmonic Analysis of a General Purpose Inverter for Induction Motor Drives", the Institute of Electrical Engineers of Japan Transactions D, the Institute of Electrical Engineers of Japan, 1989, Vol. 109, No. 11, p. 809-816, for example. In the circular locus method, magnetic flux in the load is controlled every predetermined control cycle.

Further, Japanese Patent Application Laid-Open Publication No. 11-4594, Japanese Patent No. 3664040, Japanese Patent No. 4643404 and Japanese Patent Application Laid-Open Publication No. 2011-234428 are also listed as prior art documents to describe problems later.

SUMMARY

Problems to be Solved

Japanese Patent No. 3289281 and Ohyama and four others, "A Novel Current Control Technique for Voltage Source Inverter in Field Oriented Control", the Institute of Electrical Engineers of Japan Transactions B, the Institute of Electrical Engineers of Japan, 1985, Vol. 105, No. 11, p. 901-908, Daijyo and three others, "On the Magnetic Noise of an Induction Motor Driven by PWM Inverter", the Institute of Electrical Engineers of Japan Transactions D, the Institute of Electrical Engineers of Japan, 1988, Vol. 108, No. 3, p. 237-244 and Daijyo and three others, "On PWM Patterns and Harmonic Analysis of a General Purpose Inverter for Induction Motor Drives", the Institute of Electrical Engineers of Japan Transactions D, the Institute of Electrical Engineers of Japan, 1989, Vol. 109, No. 11, p. 809-816 lack the perspective of the above-mentioned minimum time limit, and thus fail to discuss maintaining the switching pattern for detecting line current for the minimum time limit or longer while magnetic flux is maintained throughout the control cycle in a case where the circular locus method is used.

Japanese Patent Application Laid-Open Publication No. 11-4594, Japanese Patent No. 3664040, Japanese Patent No. 4643404 and Japanese Patent Application Laid-Open Publication No. 2011-234428 disclose technology for maintaining the switching pattern for detecting line current for the minimum time limit or longer while maintaining the output voltage of the inverter throughout the control cycle in a case where so-called voltage vectors are used. These documents, however, lack the perspective of control using time integrals of the voltage vectors, and thus fail to disclose or suggest technology that is directly applicable to the circular locus method.

It is an object of the present application to provide technology for maintaining, in control using the circular locus method, the switching pattern for detecting phase current or line current for the minimum time limit or longer while maintaining the magnetic flux throughout the control cycle.

Means for Solving the Problems

The first aspect of a power converter controller according to the present disclosure is a power converter controller (6) for controlling, every predetermined cycle (T0), a power converter (3) applying three-phase voltage (Vu, Vv, Vw) to an inductive load (5) to supply three-phase current (Iu, Iv, Iw) to the inductive load.

The power converter includes three current paths. Each of the current paths has a node (Pu, Pv, Pw) and a pair of switches (4up, 4un), (4vp, 4vn), (4wp, 4wn) connected in series via the node between a pair of DC buses (LL, LH) at one of which current can be detected, and the three-phase current is output from the three nodes according to conducting/non-conducting states of the three pairs of switches. The conducting/non-conducting states are based on a plurality of switching patterns.

Voltage vectors (V0 to V7) corresponding to the switching patterns are classified into a pair of zero voltage vectors (V0, V7) and six non-zero voltage vectors (V1 to V6) other than the zero voltage vectors. A first one (V0) of the zero voltage vectors corresponds to a switching pattern in which the inductive load is connected to only a first one (LH) of the DC buses, and a second one (V7) of the zero voltage vectors corresponds to a switching pattern in which the inductive load is connected to only a second one (LL) of the DC buses. The non-zero voltage vectors are shown with the zero voltage vectors as initial points to be located every angle of π/3 in a complex plane. Each two of the non-zero voltage vectors that are located to form an angle of 2π/3 in the complex plane correspond to the switching patterns that are common in one of the current paths and different in the other two of the current paths. Each two of the non-zero voltage vectors that are located to form an angle of Π in the complex plane correspond to the switching patterns that are different in the three current paths.

The power converter controller includes a difference command generator (62), a vector command generator (63, 64, 65, 66), a switching signal generator (67), and a phase-current computing unit (61).

The difference command generator (62) generates a difference command (ΔΨ(θ)) equivalent to a time integral of the three-phase voltage applied to the inductive load in one of the predetermined cycles in the complex plane.

The vector command generator generates a plurality of vector commands ([τV]*) that are respectively time integrals of the voltage vectors and compose the difference command.

The switching signal generator generates switching signals (Gup, Gyp, Gwp, Gun, Gvn, Gwn) for controlling the conducting/non-conducting states of the three pairs of switches on the basis of the vector commands.

The phase-current computing unit detects current (Id) flowing through the DC buses to obtain an estimated value for the three-phase current on the basis of the current and the vector commands.

At least two of the vector commands that are time integrals of different ones of the non-zero voltage vectors have magnitudes greater than or equal to a predetermined value (Tmin) that corresponds to a minimum required amount of time to maintain the switching patterns in order for the phase-current computing unit to detect the current.

The second aspect of the power converter controller according to the present disclosure is the first aspect, and the vector command generator includes an original vector generator (63), a correction vector generator (64), a compensation vector generator (65), and a vector integrating unit (66).

The original vector generator generates, every predetermined cycle (T0), original vectors (τ0·V0, τ7·V7, τ4·V4, τ6·V6) including a pair of original non-zero vectors (τ4·V4, τ6·V6).

The correction vector generator generates a pair of correction vectors (τ4'·V4, τ6'·V6), (τ4'a·V4, τ6'a·V6), (τ4'b·V4, τ2'b·V2), (τ6'b·V6, τ5'b·V5) every predetermined cycle (τ0).

The compensation vector generator generates a pair of compensation vectors (τ4"·V4, τ6"·V6), (τ3"a·V3, τ1"a·V1), (τ5"b·V5, τ1"b·V1), (τ2"b·V2, τ3"b·V3) every predetermined cycle (T0).

The vector integrating unit integrates the pair of the correction vectors, the pair of the compensation vectors, and at least one of no-value vectors (τ0·V0), (τ7·V7) to output the vector commands.

The pair of the original non-zero vectors are each a time integral of the non-zero voltage vector, form an angle of π/3 in the complex plane, and compose a half of the difference command (ΔΨ(θ)).

The pair of the correction vectors are each a time integral of the non-zero voltage vector, each have a magnitude greater than or equal to the predetermined value (Tmin), and correspond to mutually different ones of the non-zero voltage vectors.

One of the non-zero voltage vectors corresponding to one of the pair of the correction vectors (τ4'·V4), (τ6'·V6), (τ4'a·V4), (τ6'a·V6), (τ4'b·V4), (τ6'b·V6) and one of the non-zero voltage vectors corresponding to one of the original non-zero vectors (τ4'·V4), (τ6·V6) match each other.

The pair of the compensation vectors are each a time integral of the non-zero voltage vector, correspond to mutually different ones of the non-zero voltage vectors, and compose the difference command along with the pair of the correction vectors.

The no-value vectors are each a time integral of the zero voltage vector (V0), (V7), and have no magnitudes.

The third aspect of the power converter controller according to the present disclosure is the second aspect, and, in the vector commands, the no-value vectors are used at a start time point (ts) and/or an end time point (te) of the predetermined cycle.

In the vector commands, a difference between the number of switches conducting between the nodes and one of the DC buses in the switching patterns corresponding to the voltage vectors (V0), (V7) corresponding to the no-value vectors and the number of switches conducting between the nodes and the one of the DC buses in the switching patterns corresponding to the voltage vectors (V4), (V6) corresponding to the vector commands used immediately after the no-value vectors is one.

The fourth aspect of the power converter controller according to the present disclosure is the third aspect, and each of the non-zero voltage vectors (V4, V6) corresponding to the correction vectors and each of the non-zero voltage vectors (V4, V6) corresponding to the original non-zero vectors match each other.

The pair of the compensation vectors (τ4"·V4, τ6"·V6), (τ6"·V6, τ2"·V2), (τ2"·V2, τ3"·V3), (τ3"·V3, τ1"·V1), (τ1"·V1, τ5"·V5), (τ5"·V5, τ4"·V4) form an angle of π/3 in the complex plane.

A first one (τ6"·V6), (τ3"·V3), (τ5"·V5) of the pair of the compensation vectors is used before a second one (τ4"·V4), (τ2"·V2), (τ1"·V1) of the pair of the compensation vectors. A first number, a second number, and a third number described later have the following relationships: the first number is greater than the second number in a case where the third number is three, the first number is smaller than the second number in a case where the third number is zero, and the first number is equal to the third number in a case where the third number is one or two.

The first number denotes the number of switches conducting between the nodes and the one of the DC buses in one of the switching patterns corresponding to one of the voltage vectors (V6), (V3), (V5) corresponding to the first one of the compensation vectors.

The second number denotes the number of switches conducting between the nodes and the one of the DC buses in one of the switching patterns corresponding to one of the voltage vectors (V4), (V2), (V1) corresponding to the second one of the compensation vectors.

The third number denotes the number of switches conducting between the nodes and the one of the DC buses in one of the switching patterns corresponding to one of the voltage vectors (V7), (V6), (V4) corresponding to one of the vector commands (τ7"·V7), (τ7a"·V7), (τ0a"·V0), (τ6'·V6), (τ4'·V4), (τ6'a·V6), (τ4'a·V4) used immediately before the first one of the compensation vectors.

The fifth aspect of the power converter controller according to the present disclosure is the third aspect, and the following relationships are satisfied in a case where the sum of magnitudes (τ4+τ6) of the pair of the original non-zero vectors is smaller than or equal to a half (Tmin/2) of the predetermined value.

The correction vectors (τ4'b·V4, τ2'b·V2), (τ6'b·V6, τ5'b·V5) correspond to a pair of the non-zero voltage vectors forming an angle of 2π/3 in the complex plane.

The compensation vectors (τ5"b·V5, τ1"b·V1), (τ2"b·V2, τ3"b·V3) correspond to a pair of the non-zero voltage vectors forming an angle of π/3 in the complex plane.

One (V2), (V5) of the non-zero voltage vectors corresponding to one (τ2'b·V2), (τ5'b·V5) of the pair of the correction vectors used later and one (V5), (V2) of the non-zero voltage vectors corresponding to one (τ5"b·V5), (τ2"b·V2) of the pair of the compensation vectors used earlier form an angle of π in the complex plane.

In the fifth aspect of the power converter controller according to the present disclosure, the pair of the correction vectors each desirably have a magnitude equal to the predetermined value (Tmin). One (τ1"b·V1), (τ3"b·V3) of the pair of the compensation vectors used later has a magnitude (Tmin−2(τ4+τ6)) obtained by subtracting twice the sum of the magnitudes (τ4+τ6) of the pair of the original non-zero vectors from the predetermined value (Tmin).

In the vector commands in one of the predetermined cycles, the no-value vectors are more desirably not interposed between the pair of the compensation vectors and the pair of the correction vectors.

In the second to fifth aspects of the power converter controller according to the present disclosure, the original non-zero vectors each having a magnitude greater than or equal to the predetermined value (Tmin) are desirably used as the correction vectors.

In the third to fifth aspects of the power converter controller according to the present disclosure, the original vectors are desirably used at the start time point (ts) and the end time point (te) of the predetermined cycle, and further include a pair of the no-value vectors (τ0·V0), (τ7·V7) that are equal to each other. In the vector commands, one of the pair of the no-value vectors included in the original vectors is used at least at the start time point (ts) of the predetermined cycle.

Effects

According to the first aspect of the power converter controller according to the present disclosure, in controlling the power converter, current of each phase flowing from the power converter to the inductive load is estimated from current flowing through the DC buses without impairing the overall magnetic flux locus.

According to the second aspect of the power converter controller according to the present disclosure, magnitudes of at least two of the vector commands corresponding to different ones of the non-zero voltage vectors are made to be greater than or equal to the predetermined value.

According to the third aspect of the power converter controller according to the present disclosure, the number of switching times is reduced.

According to the fourth aspect of the power converter controller according to the present disclosure, the number of switching times is further reduced.

According to the fifth aspect of the power converter controller according to the present disclosure, magnetic flux deviation is reduced compared to an aspect in which the number of switching times is minimized.

Objects, features, aspects and advantages of the present disclosure will become more apparent from the following detailed description and the accompanying drawings.

BRIEF DESCRIPTION OF DRAWINGS

FIG. 1 is a block diagram describing a power converter controller according to each embodiment;

FIG. 2 is a vector diagram showing voltage vectors used in each embodiment;

FIG. 4 is a vector diagram showing a difference command;

FIGS. 12 to 14 are vector diagrams showing the composite compensation vector and a pair of compensation vectors composing the composite compensation vector in the first embodiment;

FIG. 15 is a vector diagram showing original vectors, correction vectors, and a composite compensation vector in the predetermined cycle in the first embodiment;

FIG. 31 is a vector diagram showing original vectors to which a second embodiment is applicable;

FIGS. 36 to 38 are timing charts showing the lengths of times for which voltage vectors are used.

DESCRIPTION OF EMBODIMENTS

Basic Concepts

Figure 3:
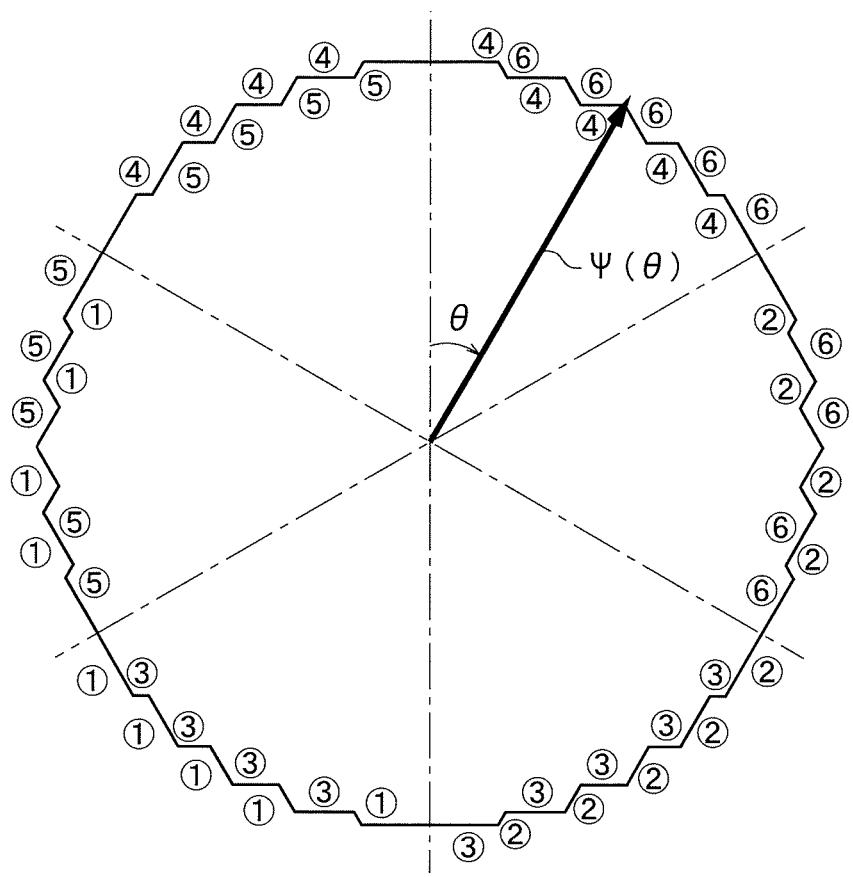
FIG. 3 is a vector diagram showing a magnetic flux vector indicating rotational magnetic flux and a locus shown thereby in a complex plane.

Prior to description of details of embodiments, the basic concepts underlying these embodiments are described. The basic concepts can obviously be grasped as one embodiment of the present disclosure.

FIG. 1 is a block diagram describing a power converter controller according to embodiments described below. An inverter 3, which is a power converter, includes three current paths that are connected in parallel to each other between a pair of DC buses LH and LL. DC voltage E is applied across the DC buses LH and LL, and a potential of the DC bus LH is higher than a potential of the DC bus LL.

The three current paths have respective nodes Pu, Pv, and Pw. The current path having the node Pu includes a pair of switches 4*up* and 4*un* that are connected in series via the node Pu between the DC buses LH and LL. The current path having the node Pv includes a pair of switches 4*vp* and 4*vn* that are connected in series via the node Pv between the DC buses LH and LL. The current path having the node Pw includes a pair of switches 4*wp* and 4*wn* that are connected in series via the node Pw between the DC buses LH and LL. The switches 4*up*, 4*vp*, and 4*wp* are respectively disposed closer to the DC bus LH than the switches 4*un*, 4*vn*, and 4*wn* are.

The inverter 3 applies voltage Vu, Vv, and Vw from the nodes Pu, Pv, and Pw to an inductive load 5 according to opening and closing (conducting/non-conducting states) of the switches 4*up*, 4*vp*, 4*wp*, 4*un*, 4*vn*, and 4*wn* to supply current Iu, Iv, and Iw to the inductive load 5. The current Iu, Iv, and Iw is three-phase line current, and the voltage Vu, Vv, and Vw is three-phase phase voltage. The inductive load 5 is a three-phase load, and is a motor, for example. In the motor, rotational magnetic flux corresponding to a magnetic flux vector described later is formed (see, for example, Daijyo and three others, "On PWM Patterns and Harmonic Analysis of a General Purpose Inverter for Induction Motor Drives", the Institute of Electrical Engineers of Japan Transactions D, the Institute of Electrical Engineers of Japan, 1989, Vol. 109, No. 11, p. 809-816).

For the sake of simplicity, description is made below by taking a case where the inductive load 5 has a so-called wye-connected three-phase coil as an example. Phase current thus has the same meaning as line current. Besides, in a case where the inductive load 5 has a delta-connected three-phase coil, the phase current is easily estimated from the line current, and thus description thereof is omitted herein.

DC link current Id flowing through the DC bus LL is direct current, and flows in a direction away from the inverter 3. As a method for detecting the DC link current Id, a method of measuring voltage drop in a resistance element, and a method using a current transformer for measurement are known. The DC link current Id also flows through the DC bus LH in a direction towards the inverter 3. A means for detecting the DC link current Id may be provided to either the DC bus LL or LH.

An inverter controller 6, which is a power converter controller, outputs switching signals Gup, Gyp, Gwp, Gun, Gvn, and Gwn for respectively controlling opening and closing of the switches 4*up*, 4*vp*, 4*wp*, 4*un*, 4*vn*, and 4*wn* to control the inverter 3. That is to say, a switching pattern of the inverter 3 is directly determined by the switching signals Gup, Gyp, Gwp, Gun, Gvn, and Gwn.

More specifically, the inverter controller 6 includes a phase-current computing unit 61, a difference command generator 62, an original vector generator 63, a correction vector generator 64, a compensation vector generator 65, a vector integrating unit 66, and a switching signal generator 67.

The phase-current computing unit 61 detects the DC link current Id, and performs computation on the basis of the DC link current Id and vector commands [τV]* to obtain an estimated value for the three-phase current Iu, Iv, and Iw. A mark [ ] is herein used as an expression to clarify that a mark enclosed by the mark [ ] has meaning as a whole, and does not represent the product of τ and V (the same applies hereinafter).

The vector commands [τV]* include information on the switching pattern of the inverter 3 and time for which the switching pattern is used, as described later. Details of a method for computing the phase current from the information and the DC link current Id are omitted herein as they are known.

The switching signal generator 67 generates the switching signals Gup, Gyp, Gwp, Gun, Gvn, and Gwn on the basis of the vector commands [τV]*, more specifically, on the basis of the switching pattern and the time for which the switching pattern is used included in the vector commands [τV]*. Details of a method for generating the switching signals are omitted herein as they are also known.

The difference command generator 62 generates a difference command ΔΨ(θ) on the basis of the current Iu, Iv, and Iw (strictly speaking, this is an estimated value therefor, but the estimated value is hereinafter used interchangeably with an actual value for the sake of simplicity) and a current command I*, which is a command value for the current Iu, Iv, and Iw.

The difference command generator 62 may use a speed command in place of an input of the current Iu, Iv, and Iw and the current command I*. In this case, an output of speed control is used as the difference command ΔΨ(θ). The current Iu, Iv, and Iw is used as information for sensorless vector control, for example.

The difference command ΔΨ(θ) matches a command value for a change of a magnetic flux vector in a cycle in which the inverter controller 6 controls the inverter 3. Details are described in order below.

Voltage vectors are described first. FIG. 2 is a vector diagram showing voltage vectors used in the basic concepts and each embodiment. As is known, the voltage vectors are shown in the complex plane. The inverter 3 operates so as to correspond to three phases, namely, a U phase, a V phase, and a W phase, and the voltage E or voltage 0 is ideally applied across the DC bus LL and the nodes Pu, Pv, and Pw. As for a three-digit numerical value determining each voltage vector, 1 or 0 in the fours place is used in accordance with the voltage E or 0 applied to the node Pu, 0 or 1 in the twos place is used in accordance with the voltage E or 0 applied to the node Pv, and 1 or 0 in the ones place is used in accordance with the voltage E or 0 applied to the node Pw. Further, the three-digit value is grasped as a binary number, and a value obtained by converting the binary number into a decimal number is used as the number of the voltage vector.

A voltage vector V0 corresponding to applying the voltage 0 to each of the nodes Pu, Pv, and Pw, and a voltage vector V7 corresponding to applying the voltage E to each of the nodes Pu, Pv, and Pw have no magnitudes in FIG. 2. These voltage vectors V0 and V7 are commonly referred to as zero voltage vectors. The zero voltage vector V0 corresponds to connecting the inductive load 5 to only the DC bus LL, and the zero voltage vector V7 corresponds to connecting the inductive load 5 to only the DC bus LH.

Voltage vectors V1 to V6 other than the zero voltage vectors are herein referred to as non-zero voltage vectors. The non-zero voltage vectors V1 to V6 are shown in the complex plane so as to satisfy the following relationships:

(i) The non-zero voltage vectors are shown with the zero voltage vectors as initial points to be located every angle of $\pi/3$ in the complex plane;

(ii) Each two of the non-zero voltage vectors that are located to form an angle of $2\pi/3$ in the complex plane correspond to the switching patterns that are common in one of the current paths and different in the other two of the current paths; and (iii) Each two of the non-zero voltage vectors that are located to form an angle of $\pi$ in the complex plane correspond to the switching patterns that are different in the three current paths.

When the relationship (i) is described by taking an example, the voltage vector V5 is located to form an angle of $\pi/3$ with respect to each of the voltage vectors V1 and V4 shown adjacent to the voltage vector V5.

When the relationship (ii) is described by taking an example, the voltage vectors V4 and V2 are located to form an angle of $2\pi/3$, and correspond to the switching patterns that are common in the current path of the W phase (values in the ones places of the three-digit numerical values determining the voltage vectors are 0 in common) and different in the current path of the V phase (values in the twos places of the above-mentioned three-digit numerical values are 0 and 1, and are different) and different in the current path of the U phase (values in the fours places of the above-mentioned three-digit numerical values are 1 and 0, and are different).

When the relationship (iii) is described by taking an example, the voltage vectors V4 and V3 are located to form an angle of $\pi$, and are different in numerical values in all the three places determining the voltage vectors.

Here, the zero voltage vector V0 and the non-zero voltage vectors V1, V2, and V4 correspond to the switching patterns that are common in two of the current paths (values in two places of the three-digit numerical values determining the voltage vectors are 0 in common) and different in the other one of the current paths. The zero voltage vector V7 and the non-zero voltage vectors V3, V5, and V6 correspond to the switching patterns that are common in two of the current paths (values in two places of the three-digit numerical values determining the voltage vectors are 1 in common) and different in the other one of the current paths.

When the voltage vector is switched, it is desirable to use the voltage vectors corresponding to the switching patterns that are common in two of the current paths before and after switching to reduce a switching loss. For example, after the voltage vector V4 is used, it is desirable to use any one of the voltage vectors V0, V5, and V6 from the perspective of reducing the switching loss. This is to reduce the number of switching times.

Here, since the DC voltage E is input into the inverter 3 through the DC buses LH and LL, the non-zero voltage vectors each have a magnitude of $\sqrt{(2/3)} \cdot E$. Variations of the magnetic flux vector indicating rotational magnetic flux linked with a coil of the motor are expressed as time integrals of the non-zero voltage vectors.

To associate the time integrals with the magnitudes of the non-zero voltage vectors, description is yet made below on the assumption that the non-zero voltage vectors each have a magnitude of 1. In other words, description is made on the assumption that $E=\sqrt{(3/2)}$ is satisfied.

FIG. 3 is a vector diagram showing a magnetic flux vector $\Psi(\theta)$ indicating rotational magnetic flux and a locus of a terminal point thereof in the complex plane. From the perspective of making the rotational magnetic flux sinusoidal, the locus is ideally circular. The locus of the magnetic flux vector $\Psi(\theta)$, however, is polygonal as actual control over the inverter 3 is based on the above-mentioned voltage vectors.

In FIG. 3, circled numbers added to respective sides of the polygon are the numbers of the voltage vectors. The time integrals of the voltage vectors indicated by the numbers are shown by the sides.

As understood from FIG. 3, the complex plane is divided on an angle θ into areas set every angle of $\pi/3$. The angle θ is herein defined as an angle that the magnetic flux vector $\Psi(\theta)$ forms in a clockwise direction with respect to a composite vector obtained by composing the voltage vectors V1 and V5 ($0 \leq \theta \leq 2\pi$).

In the circular locus method usually, the non-zero voltage vectors used in each of the areas are limited as shown below. This is because it is desirable that the locus of the terminal point of the magnetic flux vector $\Psi(\theta)$ be circular in the complex plane as described above.

$0 \leq \theta \leq \pi/3$: the non-zero voltage vectors V4 and V6;
$\pi/3 \leq \theta \leq 2\pi/3$: the non-zero voltage vectors V6 and V2;
$2\pi/3 \leq \theta \leq \pi$: the non-zero voltage vectors V2 and V3;
$\pi \leq \theta \leq 4\pi/3$: the non-zero voltage vectors V3 and V1;
$4\pi/3 \leq \theta \leq 5\pi/3$: the non-zero voltage vectors V1 and V5; and
$5\pi/3 \leq \theta \leq 2\pi$: the non-zero voltage vectors V5 and V4.

Control over the magnetic flux in these areas is similar every angle of $\pi/3$ concerning the angle θ, and thus the following description including that in each of the embodiments is made by taking only a case where $0 \leq \theta \leq \pi/3$ is satisfied as an example. This is because description in this case is applied to the other areas by shifting the criterion of the angle $\theta$ only by an angle of $\pi/3$.

FIG. 4 is a vector diagram showing a difference command $\Delta\Psi(\theta(te))$. Magnetic flux vectors $\Psi(\theta(ts))$ and $\Psi(\theta(te))$ respectively indicate magnetic flux vectors $\Psi(\theta)$ at a start time point ts and an end time point te (=ts+T0) of a predetermined cycle T0, to which a control cycle T0 of the inverter 3 is applied. The difference command $\Delta\Psi(\theta(te))$ matches a vector pointing from the terminal point of the magnetic flux vector $\Psi(\theta(ts))$ to the terminal point of the magnetic flux $\Psi(\theta(te))$. The vector is equivalent to a time integral of the three-phase voltage Vu, Vv, and Vw in one predetermined cycle in the complex plane, and the difference command $\Delta\Psi(\theta(te))$ itself does not require obtaining the pair of the terminal points itself of the above-mentioned magnetic flux vectors.

From the perspective of making the rotational magnetic flux sinusoidal, it is desirable to locate the terminal points of the magnetic flux vectors $\Psi(\theta(ts))$ and $\Psi(\theta(te))$ on a circumference by performing proper control in the predetermined cycle T0. It is therefore desirable to obtain a plurality of vectors (hereinafter, also referred to as element vectors) composing the difference command $\Delta\Psi(\theta(te))$ in the predetermined cycle T0.

FIG. 4 shows the element vectors (hereinafter, also referred to as "original vectors") used in the circular locus method as usual. The element vectors are shown as time integrals of the voltage vectors, and, for simplicity, description is made on the assumption that the non-zero voltage vectors each have a magnitude of 1 as described above. The magnitude (length) of the element vector corresponding to each of the voltage vectors indicates time for which the voltage vector is continuously maintained. Further, the direction (direction from the initial point to the terminal point: the same applies hereinafter) of the element vector corresponding to each of the voltage vectors matches the direction of the corresponding voltage vector. The element vectors (hereinafter, also referred to as no-value vectors) corresponding to the zero voltage vectors V0 and V7 (specifically, being the time integrals of the zero voltage vectors), as exceptions, have no magnitudes as the zero voltage vectors V0 and V7 have no magnitudes and directions as shown in FIG. 2.

FIG. 4 shows a case where the original vectors sequentially maintain in the predetermined cycle T0 the zero voltage vector V0 for time $\tau 0$, the non-zero voltage vector V4 for time $\tau 4$, the non-zero voltage vector V6 for time $\tau 6$, the zero voltage vector V7 for time $\tau 7$, the non-zero voltage vector V6 for the time $\tau 6$, the non-zero voltage vector V4 for the time $\tau 4$, and the zero voltage vector V0 for the time $\tau 0$.

As described above, since the element vectors are shown as the time integrals of the voltage vectors, the element vector obtained by maintaining the non-zero voltage vector V4 for the time $\tau 4$ is, for example, shown by the product $\tau 4 \cdot V4$ of the non-zero voltage vector V4 and the time $\tau 4$. The other element vectors are shown in a similar manner. Since the non-zero voltage vectors each have a magnitude of 1, the lengths (magnitudes) of the element vectors that are the time integrals of the non-zero voltage vectors indicate times for which the non-zero voltage vectors are maintained.

The non-zero voltage vectors V4 and V6 form an angle of $\pi/3$, and thus the times $\tau 0$, $\tau 4$, $\tau 6$, and $\tau 7$ are set in the original vectors by the following formulas (note that description is in the case where $0 \leq \theta \leq \pi/3$ is satisfied as described above). It is noted that the angle $\theta$ may be either the angle $\theta(ts)$ or $\theta(te)$. This is because the length T0 of the predetermined cycle T0 is selected so as to be extremely shorter than the cycle of the rotational magnetic flux.

$\tau 4 = Ks \cdot \sin(\pi/3 - \theta) \cdot T0/2$;

$\tau 6 = Ks \cdot \sin(\theta) \cdot T0/2$; and $$2 \cdot \tau 0 + \tau 7 = T0 - 2 \cdot \tau 4 - 2 \cdot \tau 6 \quad (1)$$

For example, the following formulas are satisfied.

$\tau 0 = (T0/2 - \tau 4 - \tau 6)/2$; and $$\tau 7 = \tau 0 \times 2 \quad (2)$$

It is noted that a voltage control factor Ks is introduced in the formulas (1). The voltage control factor Ks is defined by the following formula by introducing an effective value Vi of line voltage applied to the wye-connected three-phase coil in the inductive load 5.

$$Ks = \sqrt{2}(Vi/E) \quad (3)$$

Description is continued referring back to FIG. 1. The original vector generator 63 generates original vectors [$\tau V$]. When description is made in line with FIG. 4 described above, the original vectors [$\tau V$] include element vectors $\tau 0 \cdot V0$, $\tau 4 \cdot V4$, $\tau 6 \cdot V6$, $\tau 7 \cdot V7$, $\tau 6 \cdot V6$, $\tau 4 \cdot V4$, and $\tau 0 \cdot V0$. As is apparent from FIG. 4 and the formulas (1), a pair of the element vectors $\tau 4 \cdot V4$ and $\tau 6 \cdot V6$ of the original vectors [$\tau V$] corresponding to the non-zero voltage vectors V4 and V6 appearing first composes a half of the difference command $\Delta\Psi(\theta(te))$. As described above, a pair of original vectors composing the half of the difference command $\Delta\Psi(\theta)$, and corresponding to different non-zero voltage vectors (forming an angle of $\pi/3$ in the complex plane) is referred to as original non-zero vectors. FIG. 4 shows the original non-zero vectors $\tau 4 \cdot V4$ and $\tau 6 \cdot V6$ as examples.

It is noted that the element vectors corresponding to the zero voltage vectors V0 and V7 do not directly contribute to composition of the difference command $\Delta\Psi(\theta)$. As understood from the formulas (1), the times $\tau 0$ and $\tau 7$ for which the zero voltage vectors V0 and V7 are maintained can be determined depending on the times $\tau 4$ and $\tau 6$ for which the element vectors (hereinafter, also referred to as non-zero element vectors: the original non-zero vectors are the original vectors and are the non-zero element vectors) corresponding to the non-zero voltage vectors are maintained.

Here, the non-zero element vectors correspond to the non-zero voltage vectors, but the magnitudes of the non-zero element vectors are zero when the times for which the non-zero voltage vectors are maintained are zero. In contrast, the magnitudes of the no-value vectors are always zero regardless of the times for which the zero voltage vectors are maintained.

The correction vector generator 64 generates a pair of correction vectors [$\tau V$]' every predetermined cycle T0, and the compensation vector generator 65 generates a pair of compensation vectors [$\tau V$]" every predetermined cycle T0. The following describes the correction vectors [$\tau V$]' and the compensation vectors [$\tau V$]" with use of FIGS. 5 and 6.

Figure 5:
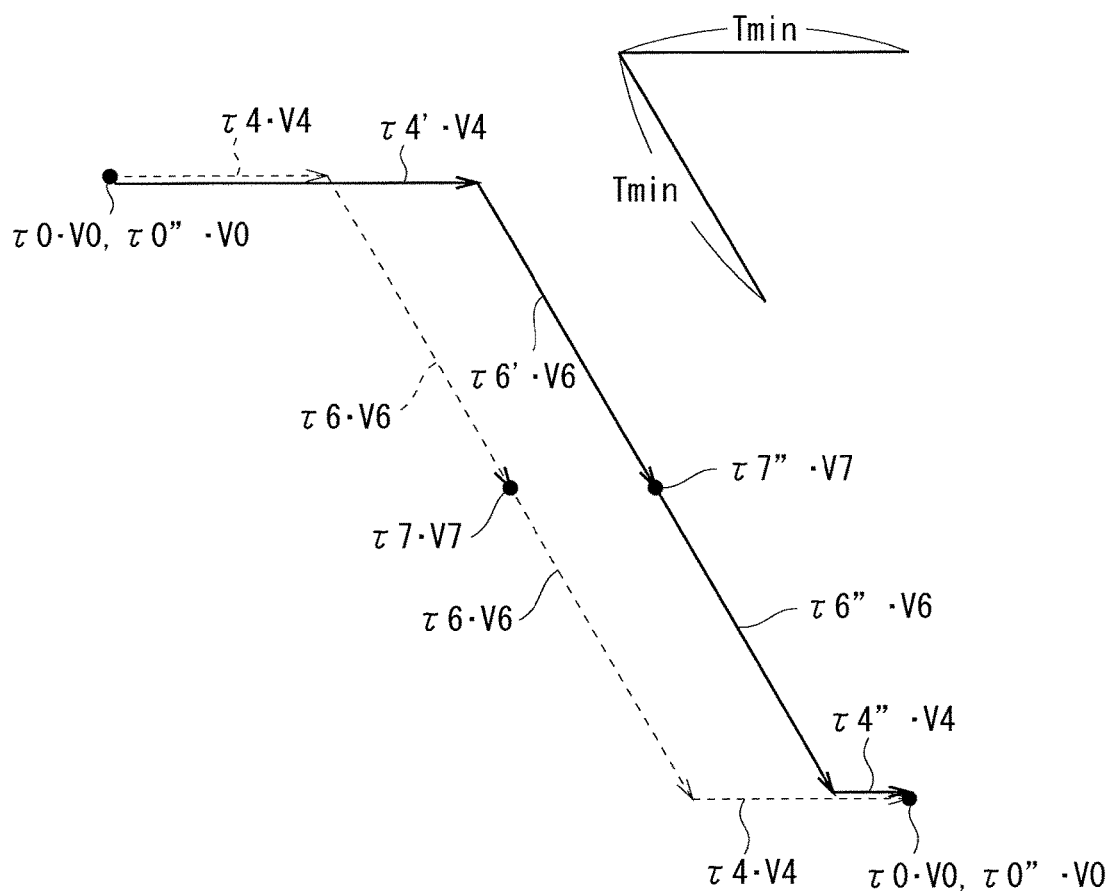
FIG. 5 is a vector diagram showing original vectors and magnetic flux vectors used in a predetermined cycle.
Figure 6:
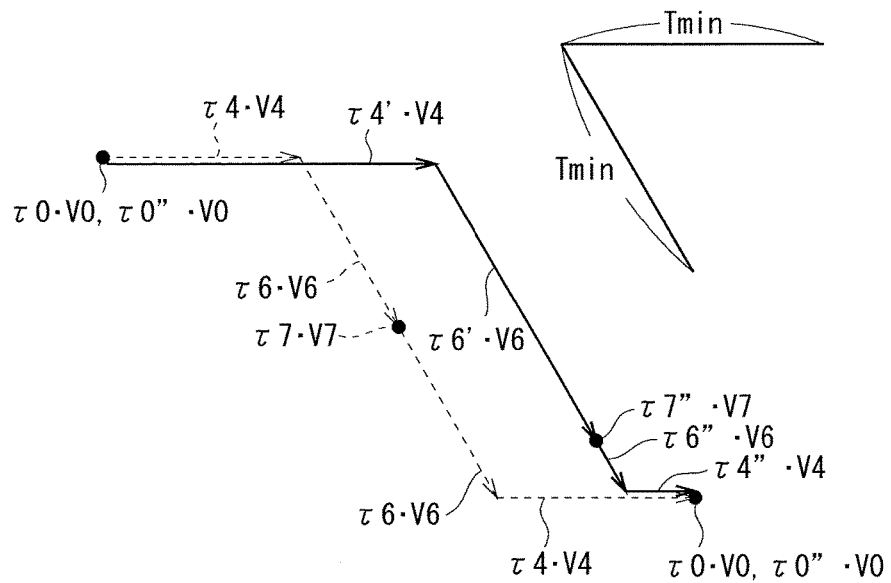
FIG. 6 is a vector diagram showing original vectors and magnetic flux vectors used in the predetermined cycle.

FIGS. 5 and 6 are each a vector diagram showing the original vectors (the original non-zero vectors are shown by dashed arrows) used in the predetermined cycle T0 and the element vectors (the non-zero element vectors are shown by solid arrows) used in the basic concepts. FIG. 5 shows a case where the time $\tau 4$ shown by the magnitude of the original non-zero vector $\tau 4 \cdot V4$ is shorter than a predetermined minimum time limit Tmin. FIG. 6 shows a case where the times $\tau 4$ and $\tau 6$ respectively shown by the magnitudes of the original non-zero vectors τ4·V4 and τ6·V6 are each shorter than the minimum time limit Tmin.

Since the current Iu, Iv, and Iw is the three-phase current, the DC link current Id flowing when each of at least two mutually different non-zero voltage vectors (excluding two non-zero voltage vectors located to form an angle of π in the complex plane, exceptionally) is used is required to estimate current of each phase. In other words, in the predetermined cycle T0, the magnitudes of the at least two mutually different non-zero element vectors (excluding those corresponding to the two non-zero voltage vectors located to form an angle of π in the complex plane, exceptionally) each have to be greater than or equal to the length indicating the minimum time limit Tmin in the complex plane in which the magnetic flux vector is shown.

Discussion is made on the assumption that the lengths of the non-zero voltage vectors are each 1 as described above, and a sign Tmin is used as the length indicating the minimum time limit Tmin in FIGS. 5 and 6.

Since the length (corresponding to the time τ4) of the element vector τ4·V4 is shorter than the length Tmin in FIG. 5, and the length (corresponding to the time τ6) of the element vector τ6·V6 is also shorter than the length Tmin in FIG. 6, the current Iu, Iv, and Iw cannot be estimated from the original vectors in either case.

To solve this problem, element vectors τ4'·V4 and τ6'·V6 each having a magnitude greater than or equal to the length Tmin are introduced as the pair of correction vectors. The following formulas are satisfied herein.

$$Tmin \leq \tau 4', Tmin \leq \tau 6' \quad (4)$$

Tmin≤τ6 is satisfied in FIG. 5, and thus τ6'=τ6 is used. This means that the original non-zero vector τ6·V6 is used as the correction vector τ6'·V6.

As described above, in a time period in which the pair of correction vectors is used, the DC link current Id can accurately be measured, and thus the current Iu, Iv, and Iw can be estimated every predetermined cycle T0.

The pair of correction vectors correspond to non-zero voltage vectors V4 and V6 different from each other, and the non-zero voltage vectors V4 and V6 are ones corresponding to the original non-zero vectors. Such a relationship is obviously not essential in the present embodiment, and the correction vectors are only required to correspond to different non-zero voltage vectors each having a magnitude greater than or equal to the length Tmin.

In a case where the zero voltage vector V0 is used, however, it is desirable to use any one of the voltage vectors V1, V2, and V4 as the non-zero voltage vector used immediately before or after the zero voltage vector V0 from the perspective of reducing the switching loss. On the other hand, use of the voltage vectors V1 and V2 is not desirable from the perspective of obtaining a vector close to the difference command ΔΨ(θ) (because the area satisfying 0≤θ≤π/3 is discussed herein). Therefore, in the case where the zero voltage vector V0 is used, it is desirable to use the voltage vector V4 as the non-zero voltage vector used immediately before or after the zero voltage vector V0. Similarly, in a case where the zero voltage vector V7 is used, it is desirable to use the voltage vector V6 as the non-zero voltage vector used immediately before or after the zero voltage vector V7 (the first matter: referenced later).

In each of the cases of FIGS. 5 and 6, the voltage vectors V0, V4, V6, V7, V6, V4, and V0 are used in this order on the basis of the original vectors. This is desirable from the perspective of reducing the switching loss described above. Therefore, after the voltage vector V0 is used at the start time point of the predetermined cycle T0, the element vectors τ4'·V4 and τ6'·V6 are used in this order as the correction vectors. It is noted that times τ0" and τ7" for which the voltage vectors V0 and V7 are maintained are highly flexible as described later.

Since the correction vectors are used, the original vectors can no longer be maintained in the predetermined cycle T0. The compensation vectors are therefore necessary. In other words, the compensation vectors are element vectors composing the difference command ΔΨ(θ) along with the pair of correction vectors. In control over the inverter 3, but the compensation vectors are also non-zero element vectors corresponding to a pair of voltage vectors different from each other.

Compensation vectors τ"6·V6 and τ4"·V4 are used in FIGS. 5 and 6. There is no need to accurately measure the DC link current Id as the correction vectors have already been used in the predetermined cycle T0. Times τ"4 and τ"6 may thus have any relationship in magnitude with the minimum time limit Tmin. In a special case of the above-mentioned relationship, one of the times τ"4 and τ"6 can be zero.

To control the inverter 3 every predetermined cycle T0, the following formula (5) has to be satisfied, additionally. A case where a no-value vector τ0"·V0 is used at each of the start time point and the end time point of the predetermined cycle T0 in which the correction vectors and the compensation vectors are used is shown herein.

$$T0=2\cdot\tau 0+\tau 7+2\cdot\tau 4+2\cdot\tau 6=2\cdot\tau 0"+\tau 7"+\tau 4'+\tau 6'+\tau 4"+\tau 6" \quad (5)$$

For example, the no-value vector τ0·V0 used in the original vectors can be used as the no-value vector τ0"·V0 used at the start time point of the predetermined cycle T0 for the sake of simplicity. In this case, the following formula (6) has to be satisfied.

$$\tau 0+\tau 7+2\cdot\tau 4+2\cdot\tau 6=\tau 0"+\tau 7"+\tau 4'+\tau 6'+\tau 4"+\tau 6" \quad (6)$$

Vectors relating to composition of the difference command ΔΨ(θ) are not the no-value vectors but the non-zero element vectors. If the formula (5) or (6) are respectively satisfied for the sum of times (2τ0"+τ7") or (τ0"+τ7"), the times τ0" and τ7" can be set freely.

Description is continued referring back to FIG. 1. In view of description made with use of FIGS. 5 and 6, the original vector generator 63 is only required to output the pair of original non-zero vectors of the original vectors [τV].

On the other hand, the compensation vectors are set so as to compose the difference command ΔΨ(θ) along with the pair of correction vectors while the relationships of the formulas (5) and (6) are satisfied. The compensation vector generator 65 thus receives the correction vectors [τV]' and the difference command ΔΨ(θ).

In contrast, the correction vector generator 64 is only required to receive the pair of original non-zero vectors, and is not required to receive the difference command ΔΨ(θ). One of the received pair of original non-zero vectors, when it has a magnitude greater than or equal to the length Tmin, it only is required to be output as one of the correction vectors [τV]' as it stands. The correction vectors [τV]' can be generated on the basis of the non-zero voltage vectors selected independently of the non-zero voltage vectors corresponding to the original non-zero vectors, at least one of which has a magnitude smaller than the length Tmin.

To approximate the locus of the terminal point of the magnetic flux vector Ψ(θ) to a circle to make the rotational magnetic flux sinusoidal, additionally, it is desirable that the non-zero voltage vectors corresponding to the original vectors and the non-zero voltage vectors corresponding to the correction vectors match each other.

It is also desirable that the order in which the correction vectors [τV]' are used and the order in which the original vectors [τV] are used match each other from the perspective of reducing the number of switching times to thereby reduce the switching loss.

In the second embodiment described later, however, a case where the non-zero voltage vectors corresponding to the original vectors and the non-zero voltage vectors corresponding to the correction vectors do not match each other is introduced from another perspective.

The vector integrating unit 66 receives the correction vectors [τV]' and the compensation vectors [τV]", sets at least one no-value vector, and integrates these vectors to output the vector commands [τV]*. When description is made in line with FIGS. 5 and 6, no-value vectors τ7"·V7 and τ"0·V0 are set, and vectors τ"0·V0, τ4'·V4, τ6'·V6, τ7"·V7, τ6"·V6, τ4"·V4, and τ"0·V0 and information on the order of the vectors are output as the vector commands [τV]*. The order of the voltage vectors and a time each of which holds in the predetermined cycle T0 are uniquely determined by the vector commands [τV]*.

The times for which the zero voltage vectors V0 and V7 are maintained are obviously flexible as described above, and thus there is no need to set each of the time for which the zero voltage vector V0 used at the start time point of the predetermined cycle T0 is maintained and the time for which the zero voltage vector V0 used in the predetermined cycle. T0 is maintained to time τ0". For example, one of the times can be set to zero, or both of the times can be set to zero (the second matter: referenced later). In the latter case, however, time τ7" becomes inflexible.

At least two of the correction vectors (time integrals of non-zero voltage vectors) [τV]', as they are included in the vector commands [τV]*, corresponding to different non-zero voltage vectors each have a magnitude greater than or equal to the length Tmin. The difference command ΔΨ(θ) is obtained in the predetermined cycle T0 by composition of the vector commands [τV]*.

As described above, when the inverter 3 is controlled on the basis of the locus of the magnetic flux vector Ψ(θ), the current Iu, Iv, and Iw flowing from the inverter 3 to the inductive load 5 can be estimated in every phase from the DC link current Id flowing through the DC bus LL without impairing the locus of the magnetic flux vector β(θ) as a whole grasped in time longer than or equal to the predetermined cycle T0.

Similar effects can be obtained in the embodiments described below as they are based on the technology described in the basic concepts.

The original vector generator 63, the correction vector generator 64, the compensation vector generator 65, and the vector integrating unit 66 can collectively be grasped as a vector command generator that generates the vector commands [τV]*.

The vector command generator includes a microcomputer and a memory. The microcomputer performs processing steps (in other words, procedures) written in a program. The above-mentioned memory includes one or more of various memories, such as a read only memory (ROM), a random access memory (RAM), a rewritable nonvolatile memory (an erasable programmable ROM (EPROM)), and a hard disk drive. The memory provides a work area for storing a variety of information, data, and the like, storing a program run by the microcomputer, and running the program.

Here, the microcomputer can be grasped so as to function as various means corresponding to the processing steps written in the program, or can be grasped so as to achieve various functions corresponding to the processing steps.

For example, the microcomputer can be grasped so as to function as various means corresponding to the original vector generator 63, the correction vector generator 64, the compensation vector generator 65, and the vector integrating unit 66.

The vector command generator may obviously achieve some or all of the original vector generator 63, the correction vector generator 64, the compensation vector generator 65, and the vector integrating unit 66 by hardware.

First Embodiment

In the first embodiment, technology for reducing the number of switching times to thereby reduce the switching loss is introduced.

FIGS. 5 and 6 each show a case where the compensation vectors τ"6·V6 and τ4"·V4 are used as the compensation vectors [τV]" as an example. However, the non-zero voltage vectors corresponding to the compensation vectors [τV]" and the non-zero voltage vectors corresponding to the original non-zero vectors of the original vectors [τV] do not always have to match each other. This is because, if the difference command ΔΨ(θ) can be obtained by composition of the correction vectors [τV]' and the compensation vectors [τV]", the locus of the magnetic flux vector Ψ(θ) as a whole grasped in time that is longer than the predetermined cycle T0 is not impaired.

To describe this in details, a vector obtained by composing a pair of compensation vectors [τV]" is hereinafter treated as a composite compensation vector Vp.

Additionally, to facilitate description in the present embodiment, in the following description, as an example, a case where, as a premise, the no-value vector τ0·V0 is used at each of the start time point and the end time point of the predetermined cycle T0 as the original vectors [τV], and the no-value vector τ0"·V0 is used at each of the start time point and the end time point of the predetermined cycle T0 in the vector commands [τV]*. Such a limitation has no effect on the method for reducing the number of switching times.

This is because of the following reasons: the difference command ΔΨ(θ) is composed only by the correction vectors [τV]' and the compensation vectors [τV]" of the vector commands [τV]*; and, if one of the original non-zero vectors has a magnitude smaller than the length Tmin, the total time for which only the correction vectors [τV]' and the compensation vectors [τV]" are used is usually shorter than the predetermined cycle T0, and thus the vector commands [τV]·always include the no-value vectors.

Even when such premise is used, flexibility remains on whether the no-value vector τ7"·V7 is used between the correction vectors [τV]' and the compensation vectors [τV]" in the vector commands [τV]*.

On the other hand, from the perspective of reducing the number of switching times, it is desirable that the non-zero voltage vectors corresponding to the correction vectors [τV]' and the non-zero voltage vectors corresponding to the original non-zero vectors match each other including the order in which the non-zero voltage vectors are used. As described above, only the case where 0≤θ≤π/3 is satisfied is described herein, and the following describes a case where the correction vectors τ'4·V4 and τ6'·V6 corresponding to the non-zero voltage vectors V4 and V6 are used in this order from the start time point of the predetermined cycle T0.

Figure 7:
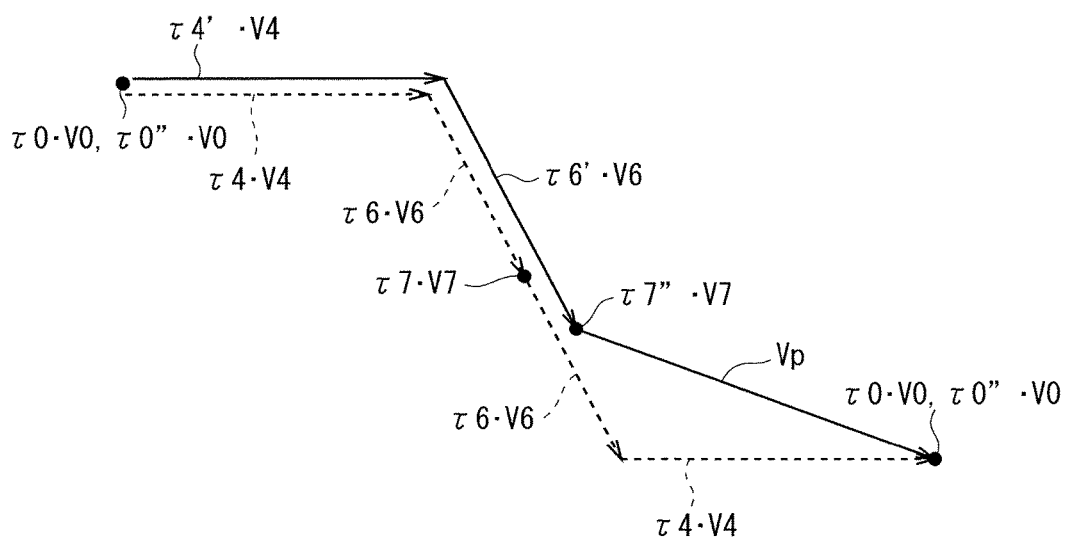
FIG. 7 is a vector diagram showing original vectors, correction vectors, and a composite compensation vector in the predetermined cycle in a first embodiment.

FIG. 7 is a vector diagram showing the original vectors (shown in dashed lines), the correction vectors, and the composite compensation vector in the predetermined cycle T0. A case where the composite compensation vector Vp falls within a triangular area formed by the voltage vectors V4 and V6 and a line segment connecting each terminal point of the voltage vectors V4 and V6 in FIG. 2 is shown herein as an example. In such a case, the relationships of formulas (7) are satisfied.

$$2\cdot\tau 4-\tau 4'\geq 0,\ 2\cdot\tau 6-\tau 6'\geq 0 \tag{7}$$

Figure 8:
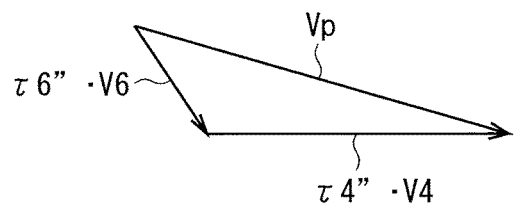
FIG. 8 is a vector diagram showing a pair of compensation vectors and the composite compensation vector composed thereof in the first embodiment.
Figure 9:
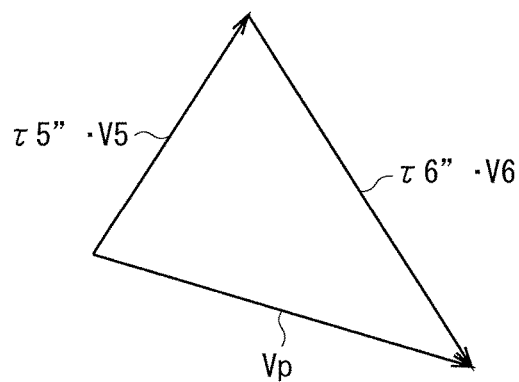
FIGS. 9 and 10 are vector diagrams showing the composite compensation vector and a pair of compensation vectors composing the composite compensation vector in the first embodiment.
Figure 10:
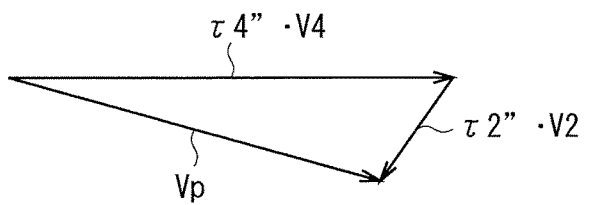

FIGS. 8 to 10 are each a vector diagram showing the composite compensation vector Vp and a pair of compensation vectors composing the composite compensation vector Vp.

FIG. 8 shows a case where the composite compensation vector Vp is composed by compensation vectors $\tau 6''\cdot V6$ and $\tau 4''\cdot V4$ respectively corresponding to two non-zero voltage vectors V6 and V4.

FIG. 9 shows a case where the composite compensation vector Vp is composed by compensation vectors $\tau 5''\cdot V5$ and $\tau 6''\cdot V6$ respectively corresponding to two non-zero voltage vectors V5 and V6.

FIG. 10 shows a case where the composite compensation vector Vp is composed by compensation vectors $\tau 4''\cdot V4$ and $\tau 2''\cdot V2$ respectively corresponding to two non-zero voltage vectors V4 and V2.

In each of the cases shown in FIGS. 8, 9, and 10, obviously, the order in which the compensation vectors are used may be switched. An aspect that can reduce the number of switching times the most from among a total of six aspects is discussed.

First, in the aspect shown in FIG. 8, in transition between the pair of compensation vectors $\tau 6''\cdot V6$ and $\tau 4''\cdot V4$, conducting/non-conducting state of the switches 4*vp* and 4*vn* of the inverter 3 are changed, and thus switching of the two elements (the change is always performed in pairs, and thus the number of times two elements corresponding to the same phase are switched is hereinafter counted as the number of switching times) is necessary. This is understandable from the fact that the non-zero voltage vectors V4 and V6 form an angle of π/3 in the complex plane shown in FIG. 2.

Next, in the aspect shown in FIG. 9, in changing between the pair of compensation vectors $\tau 5''\cdot V5$ and $\tau 6''\cdot V6$, the conducting/non-conducting state of the switches 4*vp*, 4*vn*, 4*wp*, and 4*wn* of the inverter 3 are swapped, and it is necessary to perform switching twice. This is understandable from the fact that the non-zero voltage vectors V5 and V6 form an angle of 2π/3 in the complex plane.

Similarly, in the aspect shown in FIG. 10, in changing between the pair of compensation vectors $\tau 4''\cdot V4$ and $\tau 2''\cdot V2$, the conducting/non-conducting state of the switches 4*up*, 4*un*, 4*vp*, and 4*vn* of the inverter 3 are swapped, and it is necessary to perform switching twice. This is understandable from the fact that the non-zero voltage vectors V4 and V2 form an angle of 2π/3 in the complex plane.

It is found from the above-mentioned description that it is desirable to use the compensation vectors $\tau 6''\cdot V6$ and $\tau 4''\cdot V4$ as the compensation vectors [τV]'' in a case where the composite compensation vector Vp is as shown in FIG. 7, i.e., a case where the relationships of the formulas (7) are satisfied.

The order in which the compensation vectors [τV]'' are used is discussed next. In a case where the vector commands [τV]* adopt the no-value vector $\tau 7''\cdot V7$, which is used immediately after the correction vector $\tau 6'\cdot V6$, and is thus used immediately before one of the compensation vectors [τV]'' used earliest. In the case where the no-value vector $\tau 7''\cdot V7$ is used, it is therefore desirable that the non-zero voltage vector corresponding to the one of the compensation vectors [τV]'' used earliest be not the non-zero voltage vectors V1, V2, and V4 but the non-zero voltage vectors V3, V5, and V6 to reduce the number of switching times.

From this perspective, it is desirable to use the compensation vectors $\tau 6''\cdot V6$ and $\tau 4''\cdot V4$ in this order as shown in FIG. 8.

A case where the no-value vector $\tau 7''\cdot V7$ is not used in the vector commands [τV]* is discussed next. In this case, to reduce the number of switching times, it is the most desirable that the non-zero voltage vector corresponding to the one of the compensation vectors [τV]'' used earliest be the non-zero voltage vector V6, which is the same as the non-zero voltage vector V6 corresponding to the correction vector $\tau 6'V6$ used later.

As described above, the aspects in which one of the compensation vectors [τV]'' corresponds to the non-zero voltage vector V6 are shown in FIGS. 8 and 9. As described above, however, the number of switching times in transition between the compensation vectors [τV]'' is smaller in the aspect shown in FIG. 8. It is therefore desirable to use the compensation vectors $\tau 6''\cdot V6$ and $\tau 4''\cdot V4$ in this order in the case where the no-value vector $\tau 7''\cdot V7$ is not used in the vector commands [τV]* as in the case where the no-value vector $\tau 7''\cdot V7$ is used.

It is desirable to use the compensation vector $\tau 4''\cdot V4$ after the compensation vector $\tau 6''\cdot V6$ also because the no-value vector $\tau 0''\cdot V0$ is used immediately after the compensation vector $\tau 4''\cdot V4$. This is because the number of times the conducting/non-conducting state are changed is smaller by one in transition between the non-zero voltage vector V4 corresponding to the compensation vector $\tau 4''\cdot V4$ and the zero voltage vector V0 corresponding to the no-value vector $\tau 0''\cdot V0$ than in transition between the non-zero voltage vector V6 corresponding to the compensation vector $\tau 6''\cdot V6$ and the zero voltage vector V0 corresponding to the no-value vector $\tau 0''\cdot V0$.

In a case where the formulas (7) are satisfied, times $\tau 6''$ and $\tau 4''$ can be determined by formulas (8).

$$\tau 6''=2\cdot\tau 6-\tau 6',\ \tau 4''=2\cdot\tau 4-\tau 4' \tag{8}$$

Figure 11:
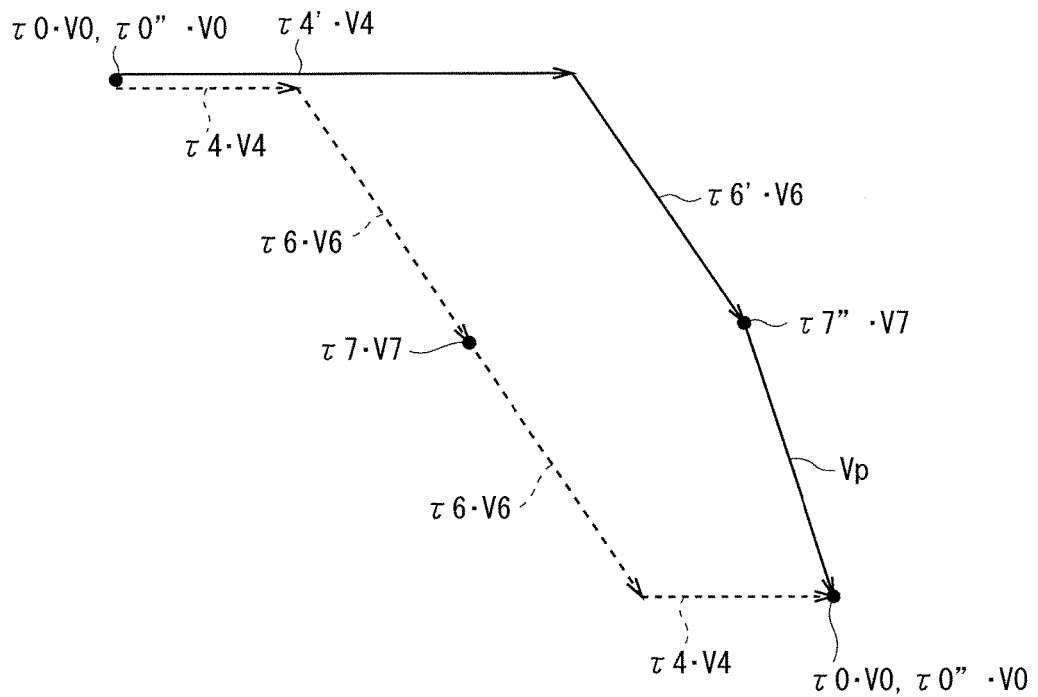
FIG. 11 is a vector diagram showing original vectors, correction vectors, and a composite compensation vector in the predetermined cycle in the first embodiment.

FIG. 11 is a vector diagram showing the original vectors (shown in dashed lines), the correction vectors, and the composite compensation vector in the predetermined cycle τ0. A case where the composite compensation vector Vp falls within a triangular area formed by the voltage vectors V6 and V2 and a line segment connecting each of the terminal points of the voltage vectors V6 and V2 in FIG. 2 is shown herein as an example. In such a case, the relationships of formulas (9) are satisfied.

$$2\cdot\tau 4-\tau 4'<0,\ 2\cdot\tau 6-\tau 6'\geq 0,\ \text{and}$$

$$|2\cdot\tau 4-\tau 4'|\leq|2\cdot\tau 6-\tau 6'| \tag{9}$$

Figure 12:
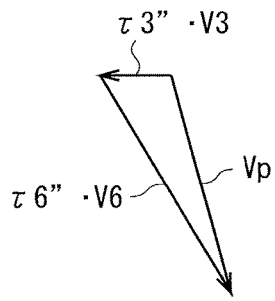
Figure 13:
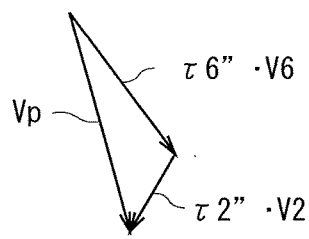

FIGS. 12 to 14 are each a vector diagram showing a pair of compensation vectors and the composite compensation vector Vp composed thereby.

FIG. 12 shows a case where the composite compensation vector Vp is composed by compensation vectors $\tau 3''\cdot V3$ and $\tau 6''\cdot V6$. FIG. 13 shows a case where the composite compensation vector Vp is composed by compensation vectors $\tau 6''\cdot V6$ and $\tau 2''\cdot V2$. FIG. 14 shows a case where the composite compensation vector Vp is composed by compensation vectors $\tau 4''\cdot V4$ and $\tau 2''\cdot V2$.

As in the discussion using FIGS. 7 to 10, it is found that the aspect that can reduce the number of switching times the most is the aspect shown in FIG. 13 regardless of whether the no-value vector τ7"·V7 is used in the vector commands [τV]*, i.e., it is desirable to use the compensation vectors τ6"·V6 and τ2"·V2 in this order.

This is because the non-zero voltage vectors V6 and V2 form an angle of $\pi/3$ in the complex plane shown in FIG. 2. Another reason is that changing in switches is not performed between the non-zero voltage vectors V6, and, in transition between the zero voltage vector V7 and the non-zero voltage vector V6, the conducting/non-conducting state of only the switches 4wn and 4wp are changed, and thus switching is performed only once. Yet another reason is that the number of times the conducting/non-conducting state are changed is smaller by one in transition between the non-zero voltage vector V2 and the zero voltage vector V0 than in transition between the non-zero voltage vector V6 and the zero voltage vector V0.

In a case where the formulas (9) are satisfied, times τ6" and τ2" can be determined by formulas (10).

$$\tau 2''=|2\cdot\tau 4-\tau 4'|, \tau 6''=|2\cdot\tau 6-\tau 6'|-\tau 2'' \quad (10)$$

FIG. 15 is a vector diagram showing the original vectors (shown in dashed lines), the correction vectors, and the composite compensation vector in the predetermined cycle T0. A case where the composite compensation vector Vp falls within a triangular area formed by the voltage vectors V2 and V3 and a line segment connecting each of the terminal points of the voltage vectors V2 and V3 in FIG. 2 is shown herein as an example. In such a case, the relationships of formulas (11) are satisfied.

$$2\cdot\tau 4-\tau 4'<0, \ 2\cdot\tau 6-\tau 6'\geq 0, \text{ and}$$

$$|2\cdot\tau 4-\tau 4'|>|2\cdot\tau 6-\tau 6'| \quad (11)$$

Figure 16:
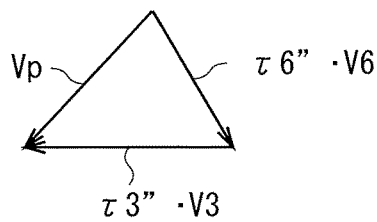
FIGS. 16 to 18 are vector diagrams showing the composite compensation vector and a pair of compensation vectors composing the composite compensation vector in the first embodiment.
Figure 17:
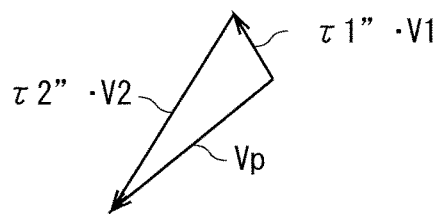
Figure 18:
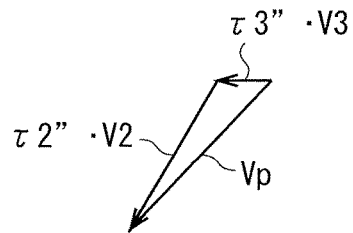

FIGS. 16 to 18 are each a vector diagram showing a pair of compensation vectors and the composite compensation vector Vp composed thereby.

FIG. 16 shows a case where the composite compensation vector Vp is composed by the compensation vectors τ6"·V6 and τ3"·V3. FIG. 17 shows a case where the composite compensation vector Vp is composed by the compensation vectors τ1"·V1 and τ2"·V2. FIG. 18 shows a case where the composite compensation vector Vp is composed by the compensation vectors τ3"·V3 and τ2"·V2.

As in the discussion using FIGS. 7 to 10, it is found that it is desirable to use the compensation vectors τ3"·V3 and τ2"·V2 as the aspect that can reduce the number of switching times the most. This is because the non-zero voltage vectors. V3 and V2 form an angle of $\pi/3$ in the complex plane shown in FIG. 2.

In the case where the no-value vector τ7"·V7 is used in the vector commands [τV]*, discussion is made as follows.

In the case where the compensation vectors τ3"·V3 and τ2"·V2 are used in this order, in transition between the zero voltage vector V7 and the non-zero voltage vector V3, the conducting/non-conducting state of the switches 4un and 4up are changed, and it is necessary to perform switching once, and, in transition between the non-zero voltage vector V2 and the zero voltage vector V0, the conducting/non-conducting state of the switches 4vn and 4vp are changed, and it is necessary to perform switching once.

In a case where the compensation vectors τ2"·V2 and τ3"·V3 are used in this order, in transition between the zero voltage vector V7 and the non-zero voltage vector V2, the conducting/non-conducting state of the switches 4un, 4up, 4wn, and 4wp are changed, and it is necessary to perform switching twice. In transition between the non-zero voltage vector V3 and the zero voltage vector V0, the conducting/non-conducting state of the switches 4vn, 4vp, 4wn, and 4wp are changed, and it is necessary to perform switching twice.

Therefore, in the case where the no-value vector τ7"·V7 is used in the vector commands [τV]*, from the perspective of reducing the number of switching times to thereby reduce the switching loss, it is desirable to use the compensation vectors τ3"·V3 and τ2"·V2 in this order.

Next, in the case where the no-value vector τ7"·V7 is not used in the vector commands [τV]*, discussion is made as follows.

In the case where the compensation vectors τ3"·V3 and τ2"·V2 are used in this order, in transition between the non-zero voltage vector V6 and the non-zero voltage vector V3, the conducting/non-conducting state of the switches 4un, 4up, 4wn, and 4wp are changed, and it is necessary to perform switching twice, and, in transition between the non-zero voltage vector V2 and the zero voltage vector V0, the conducting/non-conducting state of the switches 4vn and 4vp are changed, and it is necessary to perform switching once.

In the case where the compensation vectors τ2"·V2 and τ3"·V3 are used in this order, in transition between the non-zero voltage vector V6 and the non-zero voltage vector V2, the conducting/non-conducting state of the switches 4un and 4up are changed, and it is necessary to perform switching once. In transition between the non-zero voltage vector V3 and the zero voltage vector V0, the conducting/non-conducting state of the switches 4vn, 4vp, 4wn, and 4wp are changed, and it is necessary to perform switching twice.

That is to say, in the case where the no-value vector τ7"·V7 is not used in the vector commands [τV]*, the order of the compensation vectors τ3"·V3 and τ2"·V2 has no effect on the number of switching times.

It is therefore desirable to use the compensation vectors τ3"·V3 and τ2"·V2 in this order regardless of whether the no-value vector τ7"·V7 is used or not in the vector commands [τV]* from the perspective of reducing the number of switching times.

In the case where the formulas (11) are satisfied, times τ3" and τ2" can be determined by formulas (12).

$$\tau 2''=|2\cdot\tau 6-\tau 6|, \tau 3''=|2\cdot\tau 4-\tau 4'|-\tau 2'' \quad (12)$$

Figure 19:
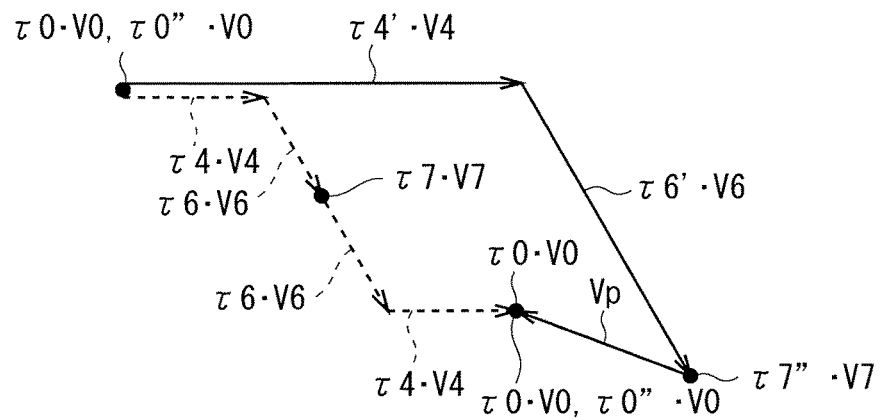
FIG. 19 is a vector diagram showing original vectors, correction vectors, and a composite compensation vector in the predetermined cycle in the first embodiment.

FIG. 19 is a vector diagram showing the original vectors (shown in dashed lines), the correction vectors, and the composite compensation vector in the predetermined cycle T0. A case where the composite compensation vector Vp falls within a triangular area formed by the voltage vectors V3 and V1 and a line segment connecting each of the terminal points of the voltage vectors V3 and V1 in FIG. 2 is shown herein as an example. In such a case, the relationships of formulas (13) are satisfied.

$$2\cdot\tau 4-\tau 4'<0, \ 2\cdot\tau 6-\tau 6'<0 \quad (13)$$

Figure 20:
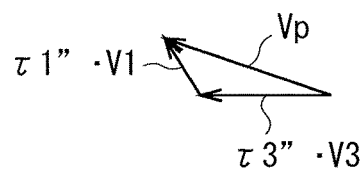
FIGS. 20 to 22 are vector diagrams showing the composite compensation vector and a pair of compensation vectors composing the composite compensation vector in the first embodiment.
Figure 21:
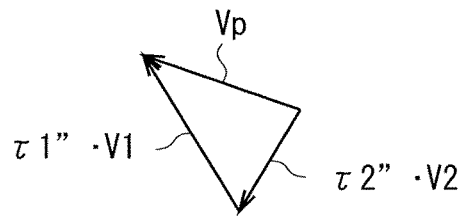
Figure 22:
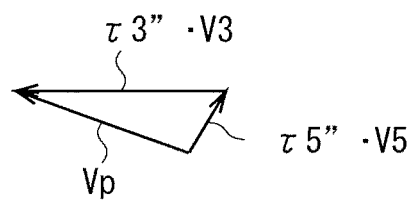

FIGS. 20 to 22 are each a vector diagram showing a pair of compensation vectors and the composite compensation vector Vp composed thereby.

FIG. 20 shows a case where the composite compensation vector Vp is composed by the compensation vectors τ3"·V3 and τ1"·V1. FIG. 21 shows a case where the composite compensation vector Vp is composed by the compensation vectors τ2"·V2 and T1"·V1. FIG. 22 shows a case where the composite compensation vector Vp is composed by the compensation vectors τ5"·V5 and τ3"·V3.

As in the discussion using FIGS. 7 to 10, it is found that it is desirable to use the compensation vectors τ3"·V3 and τ1"·V1 as the aspect that can reduce the number of switching times the most. This is because the non-zero voltage vectors V3 and V1 form an angle of π/3 in the complex plane shown in FIG. 2.

In the case where the no-value vector τ7"·V7 is used in the vector commands [τV]*, discussion is made as follows.

In the case where the compensation vectors τ3"·V3 and τ1"·V1 are used in this order, in transition between the zero voltage vector V7 and the non-zero voltage vector V3, the conducting/non-conducting state of the switches 4$un$ and 4$up$ are changed, and it is necessary to perform switching once, and, in transition between the non-zero voltage vector V1 and the zero voltage vector V0, the conducting/non-conducting state of the switches 4$wn$ and 4$wp$ are changed, and it is necessary to perform switching once.

In a case where the compensation vectors τ1"·V1 and τ3"·V3 are used in this order, in transition between the zero voltage vector V7 and the non-zero voltage vector V1, the conducting/non-conducting state of the switches 4$un$, 4$up$, 4$vn$, and 4$vp$ are changed, and it is necessary to perform switching twice. In transition between the non-zero voltage vector V3 and the zero voltage vector V0, the conducting/non-conducting state of the switches 4$vn$, 4$vp$, 4$wn$, and 4$wp$ are changed, and it is necessary to perform switching twice.

Therefore, in the case where the no-value vector τ7"·V7 is used in the vector commands [τV]*, from the perspective of reducing the number of switching times to thereby reduce the switching loss, it is desirable to use the compensation vectors τ3"·V3 and τ1"·V1 in this order.

Next, in the case where the no-value vector τ7"·V7 is not used in the vector commands [τV]*, discussion is made as follows.

In the case where the compensation vectors τ3"·V3 and τ1"·V1 are used in this order, in transition between the non-zero voltage vector V6 and the non-zero voltage vector V3, the conducting/non-conducting state of the switches 4$un$, 4$up$, 4$wn$, and 4$wp$ are changed, and it is necessary to perform switching twice, and, in transition between the non-zero voltage vector V1 and the zero voltage vector V0, the conducting/non-conducting state of the switches 4$wn$ and 4$wp$ are changed, and it is necessary to perform switching once.

In the case where the compensation vectors τ1"·V1 and τ3"·V3 are used in this order, in transition between the non-zero voltage vector V6 and the non-zero voltage vector V1, the conducting/non-conducting state of all the six switches are changed, and it is necessary to perform switching three times. In transition between the non-zero voltage vector V3 and the zero voltage vector V0, the conducting/non-conducting state of the switches 4$vn$, 4$vp$, 4$wn$, and 4$wp$ are changed, and it is necessary to perform switching twice.

It is therefore desirable to use the compensation vectors τ3"·V3 and τ1"·V1 in this order regardless of whether the no-value vector τ7"·V7 is used or not in the vector commands [τV]* from the perspective of reducing the number of switching times.

In the case where the formulas (13) are satisfied, times τ3" and τ1" can be determined by formulas (14).

$$\tau 1''=|2\tau 6-\tau 6'|, \tau 3''=|2\tau 4-\tau 4'| \tag{14}$$

Figure 23:
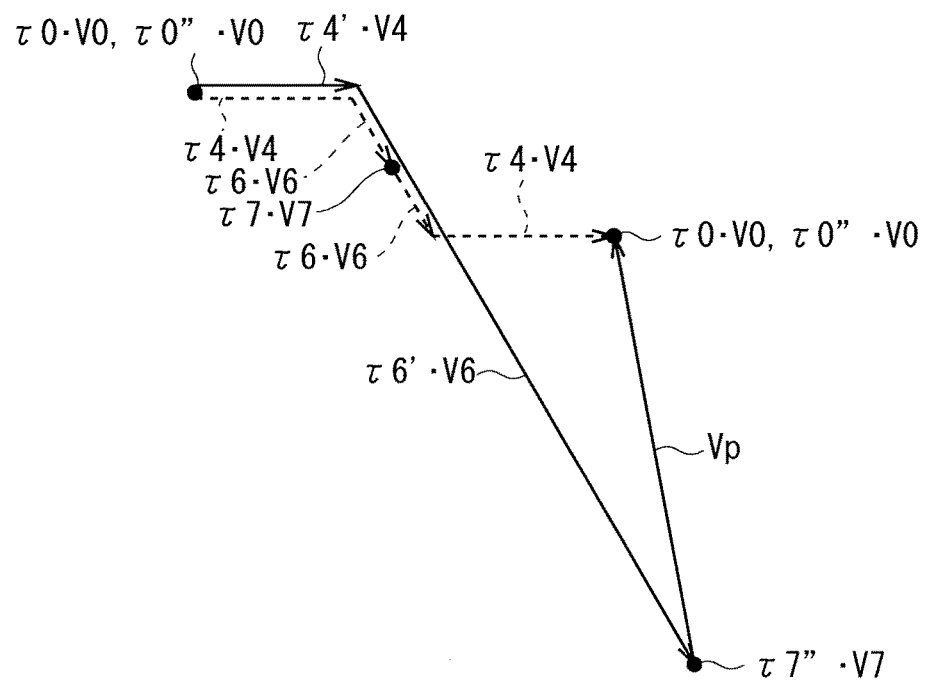
FIG. 23 is a vector diagram showing original vectors, correction vectors, and a composite compensation vector in the predetermined cycle in the first embodiment.

FIG. 23 is a vector diagram showing the original vectors (shown in dashed lines), the correction vectors, and the composite compensation vector in the predetermined cycle T0·A case where the composite compensation vector Vp falls within a triangular area formed by the voltage vectors V1 and V5 and a line segment connecting each of the terminal points of the voltage vectors V1 and V5 in FIG. 2 is shown herein as an example. In such a case, the relationships of formulas (15) are satisfied.

$$2\cdot\tau 4-\tau 4'\geq 0, \ 2\cdot\tau 6-\tau 6'<0, \text{ and}$$

$$|2\cdot\tau 4-\tau 4'|\leq|2\cdot\tau 6-\tau 6'| \tag{15}$$

Figure 24:
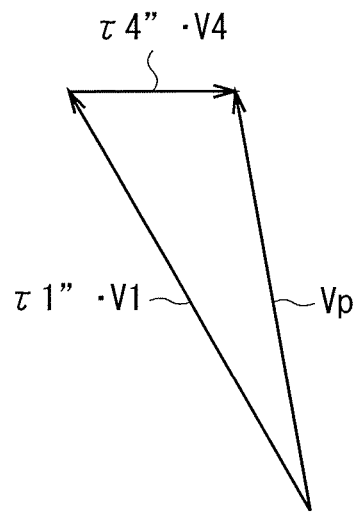
FIGS. 24 to 26 are vector diagrams showing the composite compensation vector and a pair of compensation vectors composing the composite compensation vector in the first embodiment.
Figure 25:
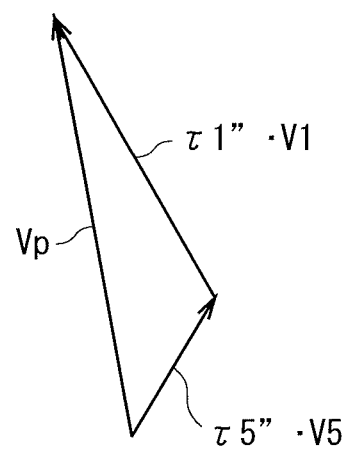
Figure 26:
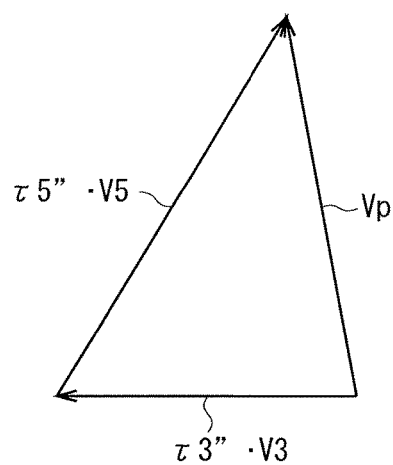

FIGS. 24 to 26 are each a vector diagram showing a pair of compensation vectors, and the composite compensation vector Vp composed thereby.

FIG. 24 shows a case where the composite compensation vector Vp is composed by the compensation vectors τ1"·V1 and τ4"·V4. FIG. 25 shows a case where the composite compensation vector Vp is composed by the compensation vectors τ5"·V5 and τ1"·V1. FIG. 26 shows a case where the composite compensation vector Vp is composed by the compensation vectors τ3"·V3 and τ5"·V5.

As in the discussion using FIGS. 19 to 22, it is desirable to use the compensation vectors τ5"·V5 and τ1"·V1 in this order as the aspect that can reduce the number of switching times the most regardless of whether the no-value vector τ7"·V7 is used in the vector commands [τV]*.

In the case where the formulas (15) are satisfied, times τ5" and τ1" can be determined by formulas (16).

$$\tau 5''=|2\cdot\tau 4-\tau 4'|, \tau 1''=|2\cdot\tau 6-\tau 6'|-\tau 5'' \tag{16}$$

Figure 27:
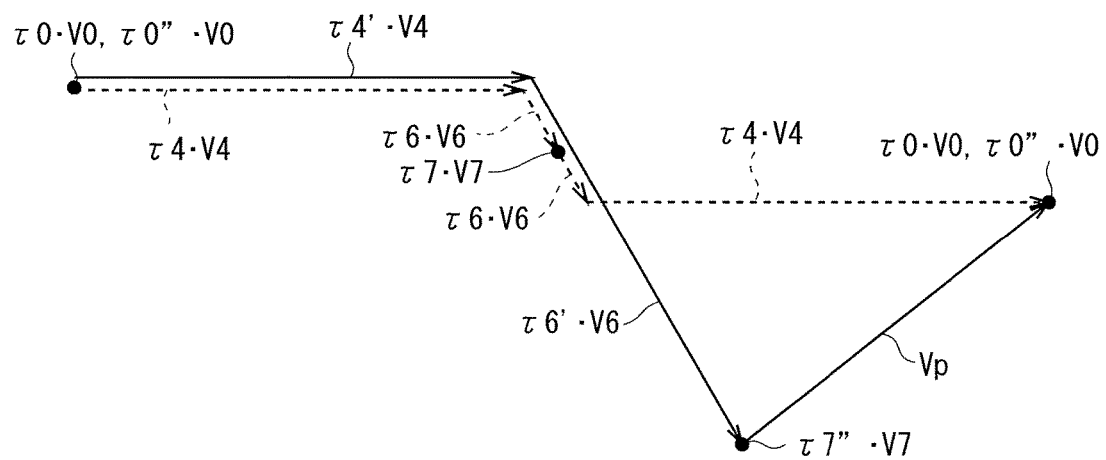
FIG. 27 is a vector diagram showing original vectors, correction vectors, and a composite compensation vector in the predetermined cycle in the first embodiment.

FIG. 27 is a vector diagram showing the original vectors (shown in dashed lines), the correction vectors, and the composite compensation vector in the predetermined cycle T0. A case where the composite compensation vector Vp falls within a triangular area formed by the voltage vectors V5 and V4 and a line segment connecting each of the terminal points of the voltage vectors V5 and V4 in FIG. 2 is shown herein as an example. In such a case, the relationships of formulas (17) are satisfied.

$$2\cdot\tau 4-\tau 4'\geq 0, \ 2\cdot\tau 6-\tau 6'<0, \text{ and}$$

$$|2\cdot\tau 4-\tau 4'|>|2\cdot\tau 6-\tau 6'| \tag{17}$$

Figure 28:
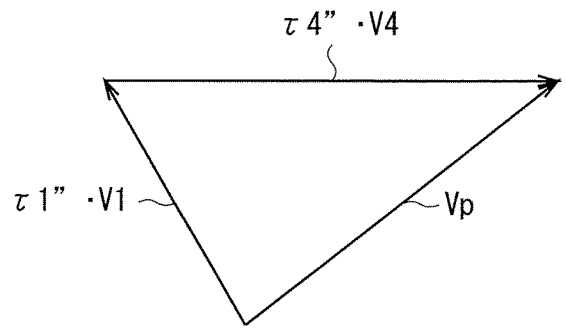
FIGS. 28 to 30 are vector diagrams showing the composite compensation vector and a pair of compensation vectors composing the composite compensation vector in the first embodiment.
Figure 29:
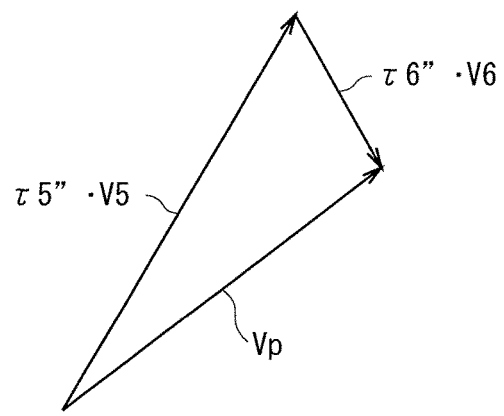
Figure 30:
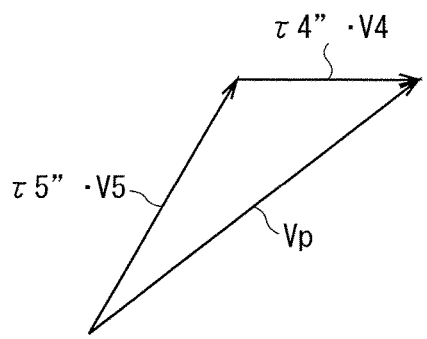

FIGS. 28 to 30 are each a vector diagram showing a pair of compensation vectors and the composite compensation vector Vp composed thereby.

FIG. 28 shows a case where the composite compensation vector Vp is composed by the compensation vectors τ1"·V1 and τ4"·V4. FIG. 29 shows a case where the composite compensation vector Vp is composed by the compensation vectors τ5"·V5 and τ6"·V6. FIG. 30 shows a case where the composite compensation vector Vp is composed by the compensation vectors τ5"·V5 and τ4"·V4.

As in the discussion using FIGS. 15 to 18, it is desirable to use the compensation vectors τ5"·V5 and τ4"·V4 in this order as the aspect that can reduce the number of switching times the most regardless of whether the no-value vector τ7"·V7 is used or not in the vector commands [τV]*.

In the case where the formulas (17) are satisfied, times τ5" and τ4" can be determined by formulas (18).

$$\tau 5''=|2\cdot\tau 6-\tau 6'|, \tau 4''=|2\cdot\tau 4-\tau 4'|-\tau 5'' \tag{18}$$

As for the above-mentioned composite compensation vector Vp, the correction vectors [τV]' and the compensation vectors [τV]" desired to be used in six situations corresponding to the formulas (7), (9), (11), (13), (15), and (17) can be summarized as follows.

First, from the perspective of reducing the number of switching times at the start time point and the end time point of the predetermined cycle T0, it is desirable to satisfy the following conditions (a) and (b).

(a) In the vector commands $[\tau V]^*$, the no-value vector is used in a start time period (a time period starting at the start time point is when description is made in line with FIG. 4) and/or an end time period (a time period ending at the end time point to when description is made in line with FIG. 4) of the predetermined cycle T0. In the above-mentioned description, the no-value vector $\tau 0''\cdot V0$ is used in the start time period and the end time period. From the perspective of reducing the number of switching times, but the end time point of one predetermined cycle T0 and the start time point of another predetermined cycle T0 following the one predetermined cycle T0 are adjacent to each other, and the vector commands $[\tau V]^*$ in which the no-value vector is provided to only one of the start time point and the end time point of the predetermined cycle T0 have no effect on the conclusion.

(b) In the vector commands $[\tau V]^*$, a difference between the number of conducting switches between the nodes Pu, Pv, and Pw and the DC bus LL (or the DC bus LH) in the switching patterns corresponding to the zero voltage vectors corresponding to the no-value vectors and the number of conducting switches between the nodes Pu, Pv, and Pw and the DC bus LL (or the DC bus LH) in the switching patterns corresponding to the voltage vectors corresponding to the vector commands $[\tau V]^*$ used immediately after the no-value vectors is one.

The following describes the above-mentioned condition (b) in more detail. First, in a switching pattern corresponding to the zero voltage vector V0 corresponding to the no-value vector $\tau 0''\cdot V0$, the number of conducting switches between the nodes Pu, Pv, and Pw and the DC bus LL is three, and the number of conducting switches between the nodes Pu, Pv and Pw and the DC bus LH is zero.

The correction vector $[\tau V]'$ used immediately after the no-value vector $\tau 0''\cdot V0$ is the correction vector $\tau 4'\cdot V4$ in each of the above-mentioned six situations. In a switching pattern corresponding to the voltage vector V4 corresponding to the correction vector $\tau 4'\cdot V4$, the number of conducting switches between the nodes Pu, Pv, and Pw and the DC bus LL is two, and the number of conducting switches between the nodes Pu, Pv and Pw and the DC bus LH is one.

Accordingly, the number of conducting switches between the nodes Pu, Pv, and Pw and the DC bus LL is three for the no-value vector $\tau 0''\cdot V0$ and two for the correction vector $\tau 4'\cdot V4$, and the difference in number is one. The number of conducting switches between the nodes Pu, Pv, and Pw and the DC bus LH is zero for the no-value vector $\tau 0''$ N0 and one for the correction vector $\tau 4'\cdot V4$, and the difference in number is also one.

Furthermore, from the perspective of reducing the number of switching times in transition between the pair of compensation vectors $[\tau V]''$ used in the vector commands $[\tau V]^*$, it is desirable to satisfy the following conditions (c) and (d).

(c) The compensation vectors form an angle of $\pi/3$ in the complex plane.

(d) When making a first compensation vector denote one of the pair of compensation vectors used earlier, and a second compensation vector denote the other one of the pair of compensation vectors used later;

making a first number denote the number of conducting switches between the nodes Pu, Pv, and Pw and the DC bus LL (or the DC bus LH) in a switching pattern corresponding to the voltage vector corresponding to the first compensation vector;

making a second number denote the number of conducting switches between the nodes Pu, Pv, and Pw and the DC bus LL (or the DC bus LH) in a switching pattern corresponding to the voltage vector corresponding to the second compensation vector; and making a third number denote the number of conducting switches between the nodes Pu, Pv, and Pw and the DC bus LL (or the DC bus LH) in a switching pattern corresponding to the voltage vector corresponding to the vector command used immediately before the first compensation vector;

(d-1) the first number is greater than the second number in a case where the third number is three;

(d-2) the first number is smaller than the second number in a case where the third number is zero; and (d-3) the first number is equal to the third number in a case where the third number is one or two.

The following describes the above-mentioned condition (d) in more detail.

In the case where the vector commands $[\tau V]^*$ adopt the no-value vector $\tau 7''\cdot V7$, the vector command used immediately before the first compensation vector is the no-value vector $\tau 7''\cdot V7$. Therefore, the third number is zero for the DC bus LL and three for the DC bus LH, which respectively correspond to the above-mentioned conditions (d-2) and (d-1).

In the case where the vector commands $[\tau V]^*$ do not adopt the no-value vector $\tau 7''\cdot V7$, the vector command used immediately before the first compensation vector is the correction vector $\tau 6'\cdot V6$. Therefore, the third number is one for the DC bus LL and two for the DC bus LH, which each correspond to the above-mentioned condition (d-3).

In the case where the formulas (7) are satisfied, the first and second compensation vectors are respectively the compensation vectors $\tau 6''\cdot V6$ and $\tau 4''\cdot V4$. Therefore, the first number is one for the DC bus LL and two for the DC bus LH, and the second number is two for the DC bus LL and one for the DC bus LH.

Accordingly, in a case where the above-mentioned condition (d-1) is examined for the DC bus LH, the first number is two and the second number is one, and thus the above-mentioned condition (d-1) is satisfied.

In a case where the above-mentioned condition (d-2) is examined for the DC bus LL, further, the first number is one and the second number is two, and thus the above-mentioned condition (d-2) is satisfied.

In a case where the above-mentioned condition (d-3) is examined for the DC bus LL, further, the third number is one and the first number is also one, and thus the above-mentioned condition (d-3) is satisfied.

In a case where the above-mentioned condition (d-3) is examined for the DC bus LH, further, the third number is two and the first number is also two, and thus the above-mentioned condition (d-3) is satisfied.

As described above, the aspect desired in the case where the formulas (7) are satisfied satisfies the condition (d).

In each of the cases where the formulas (9), (11), (13), (15), and (17) are satisfied, the first number is one for the DC bus LL and two for the DC bus LH, and the second number is two for the DC bus LL and one for the DC bus LH. Thus, the same first and second numbers as those obtained in the case where the formulas (7) are satisfied are obtained, and, in each of the cases where the formulas (9), (11), (13), (15), and (17) are satisfied, the desired aspect satisfies the condition (d).

Besides, in a case where the no-value vector used in the start time period and/or the end time period of the predetermined cycle T0 corresponds to the zero voltage vector V7 in the condition (a), the above-mentioned conditions (b), (c), and (d) also apply. In this case, the voltage vectors corresponding to the vectors used in the vector commands [τV]* are the vectors V7, V6, V4, V0, V4, V6, and V7 in this order from the start time point of the predetermined cycle T0. As with the no-value vector τ7"·V7 in the vector commands [τV]* described so far, but there is flexibility on whether the no-value vector corresponding to the zero voltage vector V0 is used or not.

In a case where the condition (b) is examined, in a switching pattern corresponding to the zero voltage vector V7 corresponding to the no-value vector τ7"·V7, the number of conducting switches between the nodes Pu, Pv, and Pw and the DC bus LL is zero, and the number of conducting switches between the nodes Pu, Pv and Pw and the DC bus LH is three.

The correction vector [τV]' used immediately after the no-value vector τ7"·V7 is the correction vector τ6'·V6 in each of the above-mentioned six situations (see the first matter shown in the "basic concepts"). In a switching pattern corresponding to the voltage vector V6 corresponding to the correction vector τ6'·V6, the number of conducting switches between the nodes Pu, Pv, and Pw and the DC bus LL is one, and the number of conducting switches between the DC bus LH is two.

The number of conducting switches between the nodes Pu, Pv, and Pw and the DC bus LL is zero for the no-value vector τ7"·V7 and one for the correction vector τ6'·V6, and the difference in number is one. The number of conducting switches between the nodes Pu, Pv, and Pw and the DC bus LH is three for the no-value vector τ7"·V7 and two for the correction vector τ6'·V6, and the difference in number is also one. This means that the condition (b) is satisfied.

It is obvious that the condition (c) is also satisfied. As for the condition (d), description can be made as follows.

In the case where the vector commands [τV]* adopt the no-value vector τ0"·V0, the vector command used immediately before the first compensation vector is the no-value vector τ0"·V0. Therefore, the third number is three for the DC bus LL and zero for the DC bus LH, which respectively correspond to the above-mentioned conditions (d-1) and (d-2).

In the case where the vector commands [τV]* do not adopt the no-value vector τ0"·V0, the vector command used immediately before the first compensation vector is the correction vector τ4'·V4. Therefore, the third number is two for the DC bus LL and one for the DC bus LH, which each correspond to the above-mentioned condition (d-3).

In the case where the formulas (7) are satisfied, the first and second compensation vectors are respectively the compensation vectors τ4"·V4 and τ6"·V6. Therefore, the first number is two for the DC bus LL and one for the DC bus LH, and the second number is one for the DC bus LL and two for the DC bus LH.

Accordingly, in a case where the above-mentioned condition (d-1) is examined for the DC bus LL, the first number is two and the second number is one, and thus the above-mentioned condition (d-1) is satisfied.

In a case where the above-mentioned condition (d-2) is examined for the DC bus LH, further, the first number is one and the second number is two, and thus the above-mentioned condition (d-2) is satisfied.

In a case where the above-mentioned (d-3) is examined for the DC bus LH, further, the third number is one and the first number is also one, and thus the above-mentioned condition (d-3) is satisfied.

In a case where the above-mentioned condition (d-3) is examined for the DC bus LL, further, the third number is two and the first number is also two, and thus the above-mentioned condition (d-3) is satisfied.

As described above, the aspect desired in the case where the formulas (7) are satisfied satisfies the condition (d). In each of the cases where the formulas (9), (11), (13), (15), and (17) are satisfied, the first number is one for the DC bus LH and two for the DC bus LL, and the second number is two for the DC bus LH and one for the DC bus LL. Thus, the same first and second numbers as those obtained in the case where the formulas (7) are satisfied are obtained, and, in each of the cases where the formulas (9), (11), (13), (15), and (17) are satisfied, the desired aspect satisfies the condition (d).

Additionally, in the case where the formulas (7) can be satisfied, each of the formulas (9), (11), (13), (15), and (17) can be satisfied by increasing the magnitudes (these magnitudes indicate times τ4' and τ6' for which the non-zero voltage vectors V4 and V6 are respectively used) of the correction vectors τ4'·V4 and τ6'·V6. To bring the locus of the terminal point of the vector Ψ(θ) close to a circle, additionally, it is desirable that the times τ4' and τ6' be as short as possible. For example, in the case where the formulas (7) can be satisfied, it is desirable that the minimum time limit Tmin be selected as each of the times τ4' and τ6'.

Second Embodiment

Daijyo and three others, "On the Magnetic Noise of an Induction Motor Driven by PWM Inverter", the Institute of Electrical Engineers of Japan Transactions D, the Institute of Electrical Engineers of Japan, 1988, Vol. 108, No. 3, p. 237-244 discloses that magnetic noise increases with increasing deviation of magnetic flux. In the second embodiment, selection of the compensation vectors [τV]" desirable from the perspective of reducing the deviation (a difference between a command value and an actual value) of the magnetic flux is described.

In the second embodiment, description is made by taking only a case where $0<\theta<\pi/3$ is satisfied as an example as in the description made so far.

FIG. 31 is a vector diagram showing original vectors to which the second embodiment is applicable. In the original vectors to which the second embodiment is applicable, the sum of the magnitudes of a pair of original non-zero vectors corresponding to different non-zero voltage vectors in the predetermined cycle T0 is required to be smaller than or equal to the half (Tmin/2) of the minimum time limit Tmin. Since $0 \leq \theta \leq \pi/3$ is satisfied herein, the original non-zero vectors τ4·V4 and τ6·V6 are used, and it is necessary to satisfy the following formula (19).

$$\tau 4 + \tau 6 \leq T\min/2 \qquad (19)$$

The original non-zero vectors τ4·V4 and τ6·V6 are used twice in the original vectors, and the second embodiment is eventually applicable to a case where the difference command $\Delta\Psi(\theta)$ (not shown) falls within an equilateral triangle in which each side has a length equal to the length Tmin.

On the other hand, as described in the basic concepts, the correction vectors each having a magnitude greater than or equal to the length Tmin are used to obtain the estimated value for the current Iu, Iv, and Iw.

That is to say, a minimum value of the magnitude of each of the correction vectors to obtain the estimated value for the current Iu, Iv, and Iw is the length Tmin. The loci of the vector commands thus fall within a parallelogram which has a vertex where the initial point (a position shown as the no-value vector τ0·V0 in FIG. 31) of the difference command ΔΨ(θ) is located and has a side and a diagonal each having a length equal to the length Tmin. In FIG. 31, the parallelogram and the above-mentioned equilateral triangle are shown in thin lines.

As described at the end of the first embodiment, it is desirable that the times τ4' and τ6' be as short as possible to bring the locus of the terminal point of the magnetic flux vector Ψ(θ) close to a circle. Therefore, in the present embodiment to reduce the deviation of the magnetic flux, a case where a formula (20) is satisfied is only required to be discussed.

$$\tau 4'=\tau 6'=T\min \quad (20)$$

It is found from the formulas (19) and (20) that a case to which the present embodiment is applied is a case where the formulas (13) are satisfied (see FIG. 19).

Figure 32:
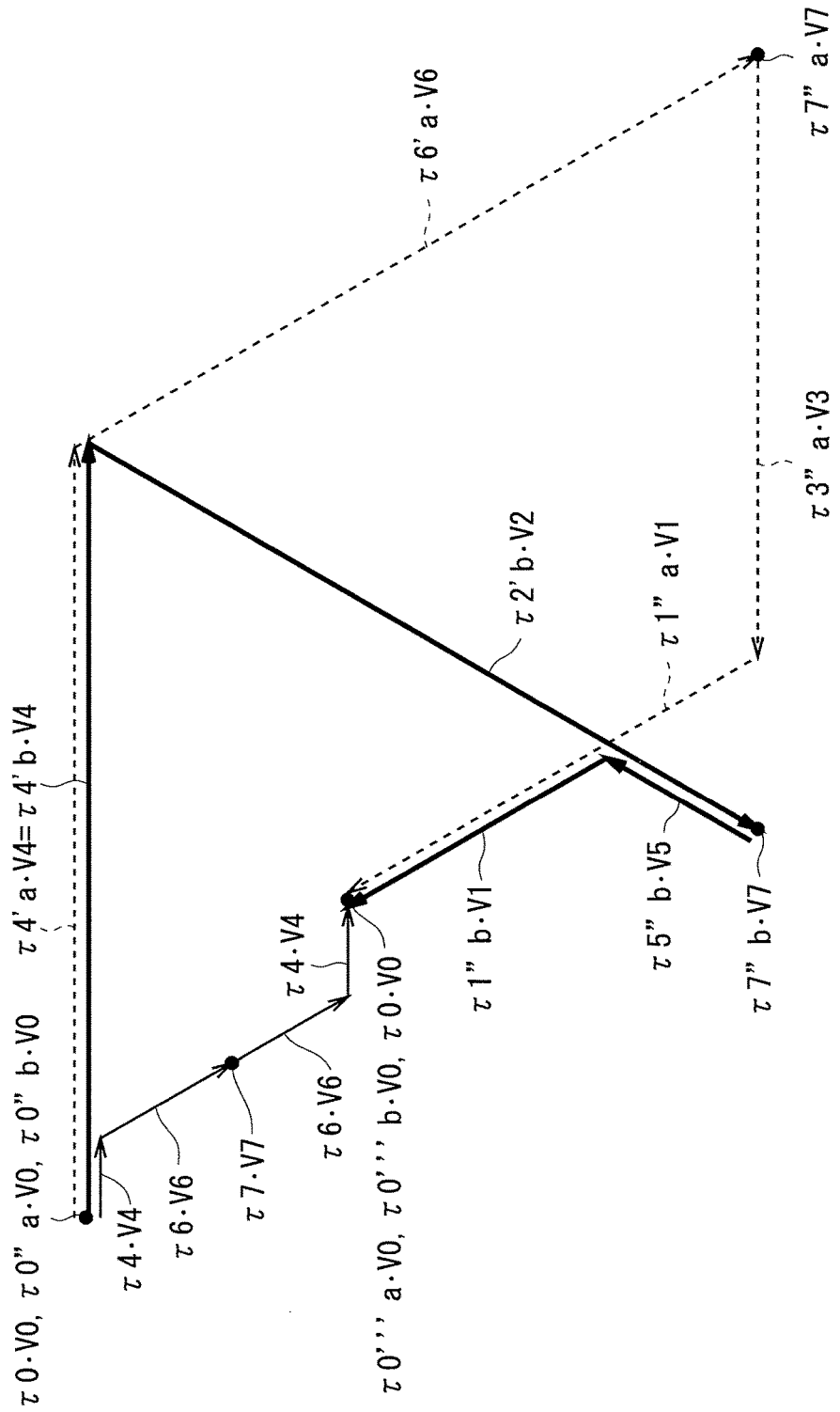
FIG. 32 is a vector diagram showing vector commands used in the second embodiment along with original vectors and the vector commands used in the first embodiment.

FIG. 32 is a vector diagram showing the vector commands used in the present embodiment along with the original vectors and the vector commands used in the first embodiment. The original vectors are shown by thin arrows, the vector commands used in the first embodiment are shown in dashed lines, and the vector commands used in the present embodiment are shown in thick lines.

The vector commands τ0"a·V0, τ4'a·V4, τ6'a·V6, τ7"a·V7, τ3"a·V3, τ1"a·V1, and τ0'"a·V0 shown in FIG. 32 respectively correspond to the vector commands τ0"·V0, τ4'·V4, τ6'·V6, τ7"·V7, τ3"·V3, τ1"·V1, and τ0"·V0 used in the first embodiment (see FIGS. 19 and 20).

As described in the first embodiment, use of these vector commands reduce the number of switching times to thereby reduce the switching loss.

On the other hand, in the present embodiment, vector commands τ0"b·V0, τ4'b·V4, τ2'b·V2, τ7"b·V7, τ5"b·V5, τ1"b·V1, and τ0'"b·V0 are used.

Besides, the following formula (21) is satisfied from the premise of the formula (20).

$$\tau 4'a=\tau 6'a=\tau 4'b=\tau 2'b=T\min \quad (21)$$

Assume that the time for which the zero voltage vector V0 is maintained in the predetermined cycle T0 typically differs in the start time period of the predetermined cycle T0 and the end time period of the predetermined cycle T0, in contrast to the first embodiment. That is to say, formulas (22) are not always satisfied.

$$\tau 0"a=\tau 0'"a, \tau 0"b=\tau 0'"b \quad (22)$$

The following describes use of the vector commands of the present embodiment that can reduce the deviation of the magnetic flux, more specifically, a time integral (hereinafter, referred to as a "magnetic flux deviation integral") of the deviation of the magnetic flux in the predetermined cycle T0 compared to the vector commands used in the first embodiment.

Figure 33:
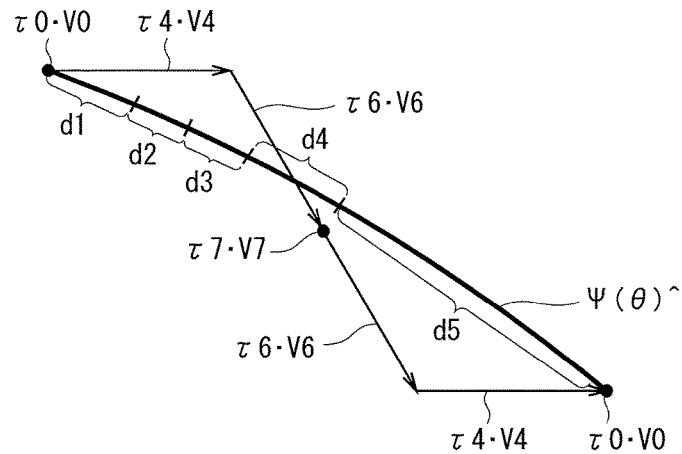
FIG. 33 is a vector diagram showing original vectors and an ideal locus of a terminal point of a magnetic flux vector.

To facilitate description, the original vectors and an ideal locus Ψ(θ)^ of the terminal point of the magnetic flux vector Ψ(θ) in the predetermined cycle T0 are shown in FIG. 33 in vector diagram. A vector pointing from the initial point to the terminal point of the locus Ψ(θ)^, which is an arc, matches the difference command Ψ(θ) (see FIG. 4).

The locus Ψ(θ)^ is divided into the following areas d1 to d5 to be grasped.

Area d1: an area in which the zero voltage vector used in the start time period of the predetermined cycle T0 is maintained;

Area d2: an area, following the area d1, in which the non-zero voltage vector is maintained;

Area d3: an area, following the area d2, in which the non-zero voltage vector different from that maintained in the area d2 is maintained;

Area d4: an area, following the area d3, in which the zero voltage vector different from that maintained in the area d1 is maintained; and Area d5: an area, following the area d4, different from the areas d1 to d4.

In a case where the vector commands in the first embodiment are used, these areas are grasped as follows:

Area d1: an area in which the zero voltage vector V0 used in the start time period of the predetermined cycle T0 is maintained for the time τ0"a;

Area d2: an area, following the area d1, in which the non-zero voltage vector V4 is maintained for the time τ4'a;

Area d3: an area, following the area d2, in which the non-zero voltage vector V6 is maintained for the time τ6'a;

Area d4: an area, following the area d3, in which the zero voltage vector V7 is maintained for time τr; and Area d5: an area, following the area d4, in which the zero voltage vector V7, the non-zero voltage vectors V3 and V1, and the zero voltage vector V0 are used in this order, and which corresponds to time (τ7"a−τ7^+τ3"a+τ1"a+τ0'"a).

In a case where the vector commands in the second embodiment are used, these areas are grasped as follows:

Area d1: an area in which the zero voltage vector V0 used in the start time period of the predetermined cycle T0 is maintained for time τ0"b;

Area d2: an area, following the area d1, in which the non-zero voltage vector V4 is maintained for time τ4'b;

Area d3: an area, following the area d2, in which the non-zero voltage vector V2 is maintained for time τ2'b;

Area d4: an area, following the area d3, in which the zero voltage vector V7 is maintained for the time τ7^; and Area d5: an area, following the area d4, in which the zero voltage vector V7, the non-zero voltage vectors V5 and V1, and the zero voltage vector V0 are used in this order, and which corresponds to time (τ7"b−τ7+τ^+τ5"b+τ1"b+τ0'"b).

It is noted that the first embodiment and the second embodiment do not always match each other in times for which the voltage vectors are maintained in the areas d1 to d5.

However, in order for the magnetic flux deviation integral of the vector commands in the second embodiment not to be larger compared to the magnetic flux deviation integral of the vector commands in the first embodiment in the area d1, it is desirable that the areas d1 in the first and second embodiments match each other, i.e., the following formula (23) be satisfied.

$$\tau 0"a=\tau 0"b \quad (23)$$

In this case, not only the areas d1 but also the vector commands used in the areas d1 match each other, and thus the magnetic flux deviation integrals in the areas d1 match each other in the case where the vector commands in the first embodiment are used and in the case where the vector commands in the second embodiment are used.

Since the formula (21) is satisfied, the areas d2 match each other in the vector commands in the first embodiment and in the vector commands in the second embodiment. The correction vectors τ4'a·V4 and τ4'b·V4 correspond to the same non-zero voltage vector V4. Therefore, the magnetic flux deviation integrals in the areas d2 match each other in the case where the vector commands in the first embodiment are used and in the case where the vector commands in the second embodiment are used.

Figure 34:
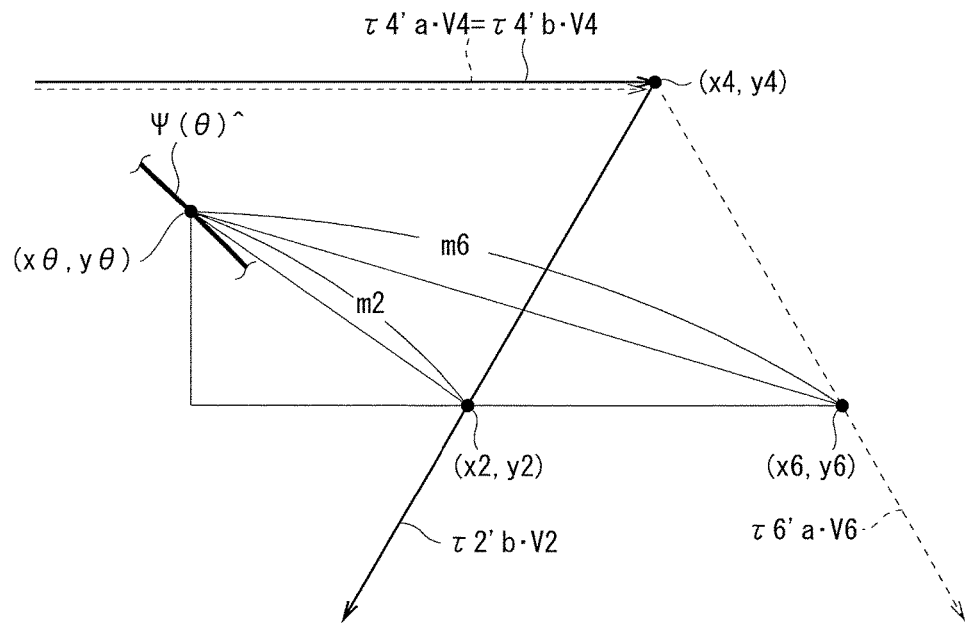
FIG. 34 is a vector diagram showing correction vectors used in the second embodiment along with the correction vectors used in the first embodiment.

FIG. 34 is a vector diagram showing the correction vectors τ4'a·V4, τ4'b·V4, τ6'a·V6, and τ2'b·V2 in a case where the terminal point of the magnetic flux vector Ψ(θ) is in the area d3. Since the formula (21) is satisfied, the earlier halves of the areas d3 match each other in the vector commands in the first embodiment and in the vector commands in the second embodiment.

In order to compare the magnetic flux deviation integral of the vector commands in the first embodiment and the magnetic flux deviation integral of the vector commands in the second embodiment in the case where the terminal point of the magnetic flux vector Ψ(θ) is in the area d3, the distance between respective points on the correction vector τ6'a·V6 and τ2'b·V2 and a point in the area d3 are compared.

As having already been described in the "basic concepts", the magnitude (length) of the element vector corresponding to each of the voltage vectors indicates time for which the voltage vector is continuously maintained. The distance m6 between a point (xθ, yθ) at a time point tp in a time period during which the terminal point of the magnetic flux vector Ψ(θ) is in the area d3 and a point (x6, y6) on the element vector τ6'a·V6 at the time point tp is shown by the following formula (24). Similarly, the distance m2 between the point (xθ, yθ) and a point (x2, y2) on the element vector τ2'b·V2 at the time point tp is shown by the following formula (25). It is noted that the x-axis is set to be parallel to the voltage vector V4, and the y-axis is set to be perpendicular to the x-axis.

$$m6=[(x\theta-x6)^2+(y\theta-y6)^2]^{1/2} \quad (24)$$

$$m2=[(x\theta-x2)^2+(y\theta-y2)^2]^{1/2} \quad (25)$$

The distances m6 and m2 indicate the absolute values of the magnetic flux deviations at the time point tp in the time period during which the non-zero voltage vectors V6 and V2 are used.

Since the formulas (21) and (23) are satisfied as described above, the point (x6, y6) on the correction vector τ6'a·V6 and the point (x2, y2) on the correction vector τ2'b·V2 at the time point tp have the relationship of the following formulas (26).

$$y2=y6, |x6-x\theta|>|x2-x\theta| \quad (26)$$

Therefore, in the case where the terminal point of the magnetic flux vector Ψ(θ) is in the area d3, the following formula (27) is always satisfied.

$$m6>m2 \quad (27)$$

It is thus found that the magnetic flux deviation integral of the vector commands in the second embodiment is smaller than that of the vector commands in the first embodiment, in the area d3.

In the area d4, the zero voltage vector V7 is maintained for the time τ7" in the case where the vector commands in the first embodiment are used and in the case where the vector commands in the second embodiment are used. In FIG. 32, the point shown by the no-value vector τ7"b·V7 is obviously closer to the terminal point (the point shown by the no-value vectors τ0'''a·V0, τ0'''b·V0, and τ0·V0 in FIG. 32) of the magnetic flux vector Ψ(θ) than the point shown by the no-value vector τ7"a·V7 is. The magnetic flux deviation integral in the area d4 is thus smaller in the case where the vector commands in the second embodiment are used than in the case where the vector commands in the first embodiment are used.

Additionally, in the area d4, the zero voltage vector V7 is maintained, and the vector command in the first embodiment is located at a vertex of the right equilateral triangle shown in FIG. 31. Since the formula (19) is further satisfied, the terminal point of the magnetic flux vector Ψ(θ) is always in the left equilateral triangle shown in FIG. 31. As a result, the magnetic flux deviation integral increases with increasing time τ7^.

In the area d4, the vector command in the second embodiment is located at a vertex of the right equilateral triangle shown in FIG. 31. As a result, the magnetic flux deviation integral increases with increasing time τ7^ also in this case. It is therefore desirable that the time τ7^ be zero, and the area d4 does not substantially exist in each of the vector commands in the first embodiment and the vector commands in the second embodiment.

Next, the deviation of the magnetic flux when the terminal point of the magnetic flux vector Ψ(θ) is at a point (xθ, yθ) in the area d5 is discussed.

Figure 35:
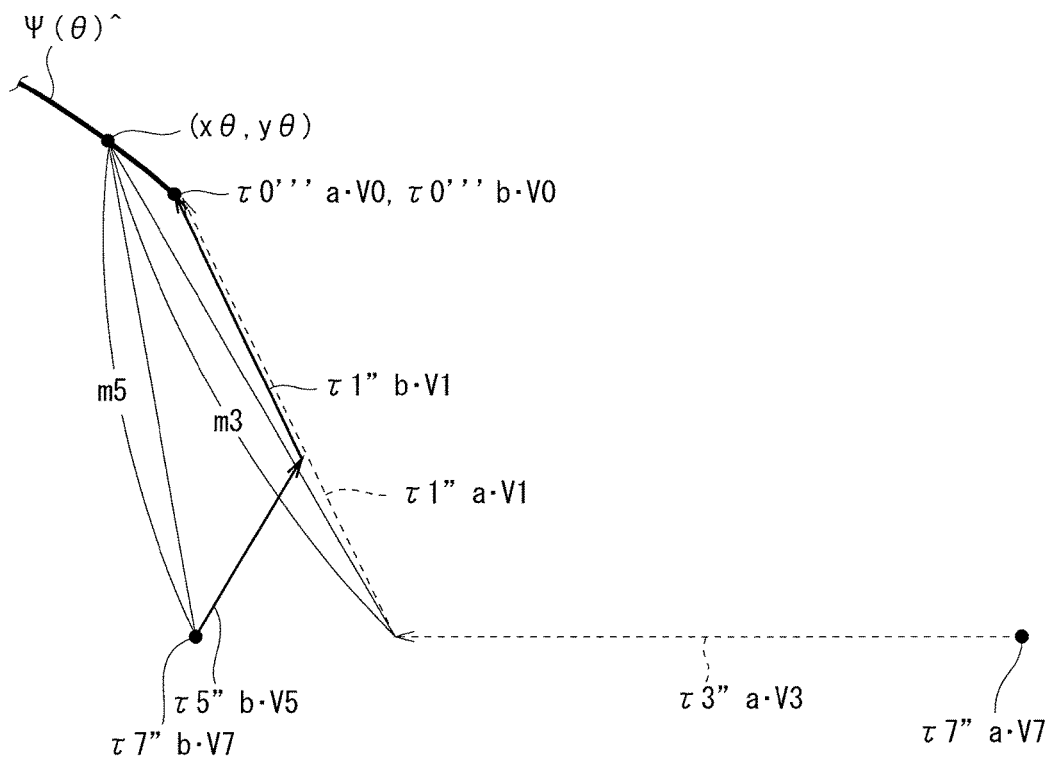
FIG. 35 is a vector diagram showing compensation vectors used in the second embodiment along with the compensation vectors used in the first embodiment.

FIG. 35 is a vector diagram showing the compensation vectors τ3"a·V3, T1"a·V1, τ5"b·V5, and τ1"b·V1 in the case where the terminal point of the magnetic flux vector Ψ(θ) is in the area d5.

The voltage vectors V2 and V3 form an angle of π/3, the voltage vectors V1 and V3 form an angle of π/3, and the voltage vectors V2 and V5 form an angle of π, and thus it is found with reference to FIG. 32 that the following formulas (28) to (30) are satisfied, and thus the following formula (31) is satisfied.

$$\tau 5"b=2T4 \quad (28)$$

$$\tau 1"b=T\min-2\cdot\tau 6-2\cdot\tau 4 \quad (29)$$

$$\tau 1"a=T\min-2\cdot\tau 6 \quad (30)$$

$$\tau 1"a=\tau 5"b+\tau 1"b \quad (31)$$

As described above, in the area d4, the magnetic flux deviation integral is set to zero by setting the time τ7^ to zero in the case where the vector commands in the second embodiment are used. Similarly, the magnetic flux deviation integral in the area d5 becomes smaller in the case where the vector commands in the second embodiment are used than in the case where the vector commands in the first embodiment are used by setting the time τ7"b to zero in the former case even if the time τ7"a is set to zero in the latter case. This is because the formula (31) is satisfied, and the magnetic flux deviation of the vector commands in the first embodiment is greater derived from the vector command τ3"a·V3. From this perspective, it is desirable that the vector integrating unit 66 integrate the correction vectors τ4'b·V4 and τ2'b·V2 and the compensation vectors τ5"b·V5 and τ1"b·V1 to obtain the vector commands without interposing the no-value vector therebetween.

Figure 36:
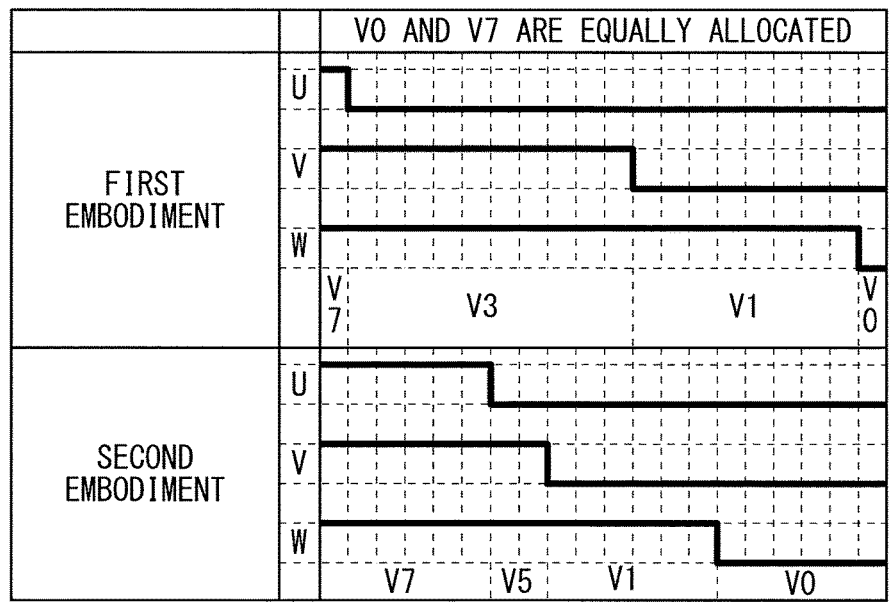
Figure 37:
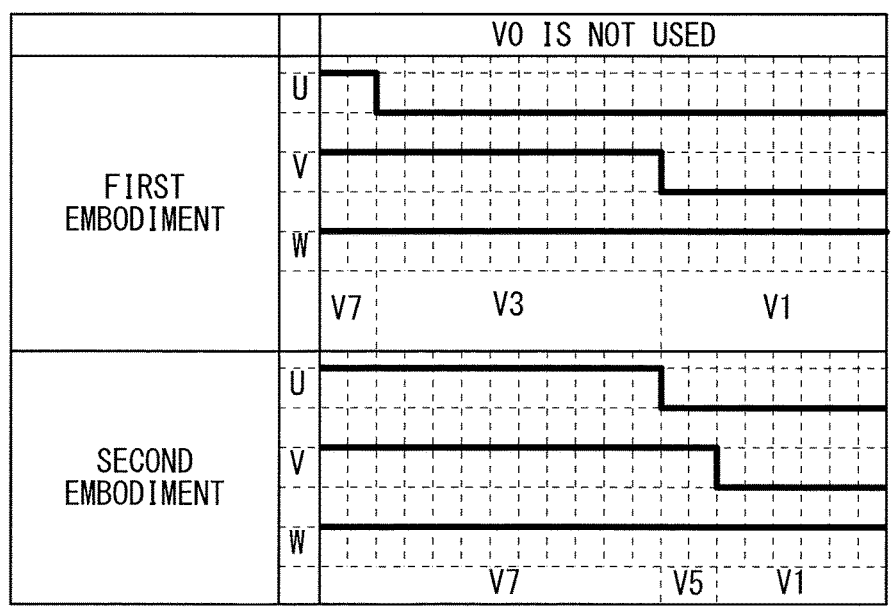

FIGS. 36 to 38 are each a timing chart showing the lengths of times for which the voltage vectors are used in the case where the vector commands are used in the area d5 on the basis of the first embodiment and the second embodiment. The timing chart shows, along with the voltage vectors, a graph indicating the conducting/non-conducting state of the switches 4up, 4vp, and 4wp by H/L in U, V, and W rows, respectively.

In first embodiment sections of FIGS. 36 to 38, time periods for which the voltage vectors V7, V3, V1, and V0 are used respectively correspond to the times τ7'''a, τ3"a, τ1"a, and τ0'''a. In second embodiment sections of FIGS. 36 to 38, time periods for which the voltage vectors V7, V5, V1, and V0 are used respectively correspond to the times τ7'''b, τ5"b, τ1"b, and τ0'''b (see the second matter in the "basic concepts").

FIG. 36 shows a case where the zero voltage vectors V0 and V7 are equally allocated, i.e., the following formulas (32) are satisfied.

$$\tau 7'''a = \tau 0'''a, \ \tau 7'''b = \tau 0'''b \tag{32}$$

FIG. 37 shows a case where the zero voltage vector V0 is not used, i.e., the following formula (33) is satisfied.

$$\tau 0'''a = \tau 0'''b = 0 \tag{33}$$

FIG. 38 shows a case where the zero voltage vector V7 is not used, i.e., the following formula (34) is satisfied.

$$\tau 7'''a = \tau 7'''b = 0 \tag{34}$$

Next, the deviation of the magnetic flux in the time period for which the non-zero voltage vector V3 is maintained for the time τ3"a in accordance with the compensation vector τ3"a·V3 in the first embodiment is discussed.

In FIG. 35, the magnetic flux deviation at the intersection of the compensation vectors τ3"a·V3 and τ1"a·V1, i.e., a time point tq of transition from the non-zero voltage vector V3 to the non-zero voltage vector V1, in the case where the vector commands in the first embodiment are used is shown by the distance m3. Similarly, the magnetic flux deviation at the intersection of the no-value vector τ7"'b·V7 and the compensation vector τ5"b·V5, i.e., a time point tr of transition from the zero voltage vector V7 to the non-zero voltage vector V5, in the case where the vector commands in the second embodiment are used is shown by the distance m5.

With reference to FIGS. 31 and 32, one of the two positions indicating the no-value vector τ0·V0 is located at the vertex of one of the two equilateral triangles (the left equilateral triangle in FIG. 31) constituting the parallelogram, and the other one of the two positions falls within the equilateral triangle. A formula (35) is therefore satisfied.

$$m3 > m5 \tag{35}$$

The time point tr is at or before the time point tq. This is because the formula (31) is satisfied, and is applied to each of the cases of FIGS. 36 to 38.

The deviation of the magnetic flux in the time period for which the non-zero voltage vector V3 is maintained in accordance with the compensation vector τ3"a·V3 in the first embodiment is greater than or equal to the distance m3. Thus, the magnetic flux deviation integral in this time period in the case where the vector commands in the second embodiment are used is smaller than or equal to that in the case where the vector commands in the first embodiment are used.

For example, a case where the time points tq and tr match each other is discussed (corresponding to the case shown in FIG. 37). In this case, the deviation of the magnetic flux in the time period for which the non-zero voltage vector V3 is maintained in accordance with the compensation vector τ3"a·V3 in the first embodiment is greater than the deviation of the magnetic flux in the case where the vector commands in the second embodiment are used in the same time period (see the formula (35)).

At and after the time points tq and tr, the compensation vector τ1"a·V1 is used in the first embodiment in the time period for which the compensation vector τ5"b·V5 is used in the second embodiment. In this time period, the magnetic flux deviation integral is smaller in the case where the vector commands in the second embodiment are used than in the case where the vector commands in the first embodiment are used, from discussion similar to that made on the distances m2 and m6 shown in FIG. 34.

The compensation vector τ1"a·V1 is then used in the first embodiment in the time period for which the compensation vector τ1"b·V1 is used in the second embodiment. In this time period, the deviation of the magnetic flux is the same in the case where the vector commands in the second embodiment are used and in the case where the vector commands in the first embodiment are used.

In the case where the time points tq and tr match each other as described above, the times τ0"'a and τ0"'b are each zero with reference to FIG. 37. Therefore, even in the case where the time points tq and tr match each other, the magnetic flux deviation integral thereafter is smaller in the case where the vector commands in the second embodiment are used than in the case where the vector commands in the first embodiment are used.

In a case where the time point tr is before the time point tq, the times τ0"'a and τ0"'b are not zero (the cases shown in FIGS. 36 and 38). The compensation vector τ0"'b·V0 is used in the second embodiment in the time period for which the no-value vector τ0"'a·V0 is used in the first embodiment. In this time period, the magnetic flux deviation integral is thus smaller in the case where the vector commands in the second embodiment are used than in the case where the vector commands in the first embodiment are used.

As a result, in each of the areas d1 to d5, the magnetic flux deviation integral in the case where the vector commands in the second embodiment are used is smaller than or is equal to that in the case where the vector commands in the first embodiment are used. Therefore, the magnetic flux deviation integral is smaller in the case where the vector commands in the second embodiment are used than in the case where the vector commands in the first embodiment are used throughout the predetermined cycle T0.

Figure 39:
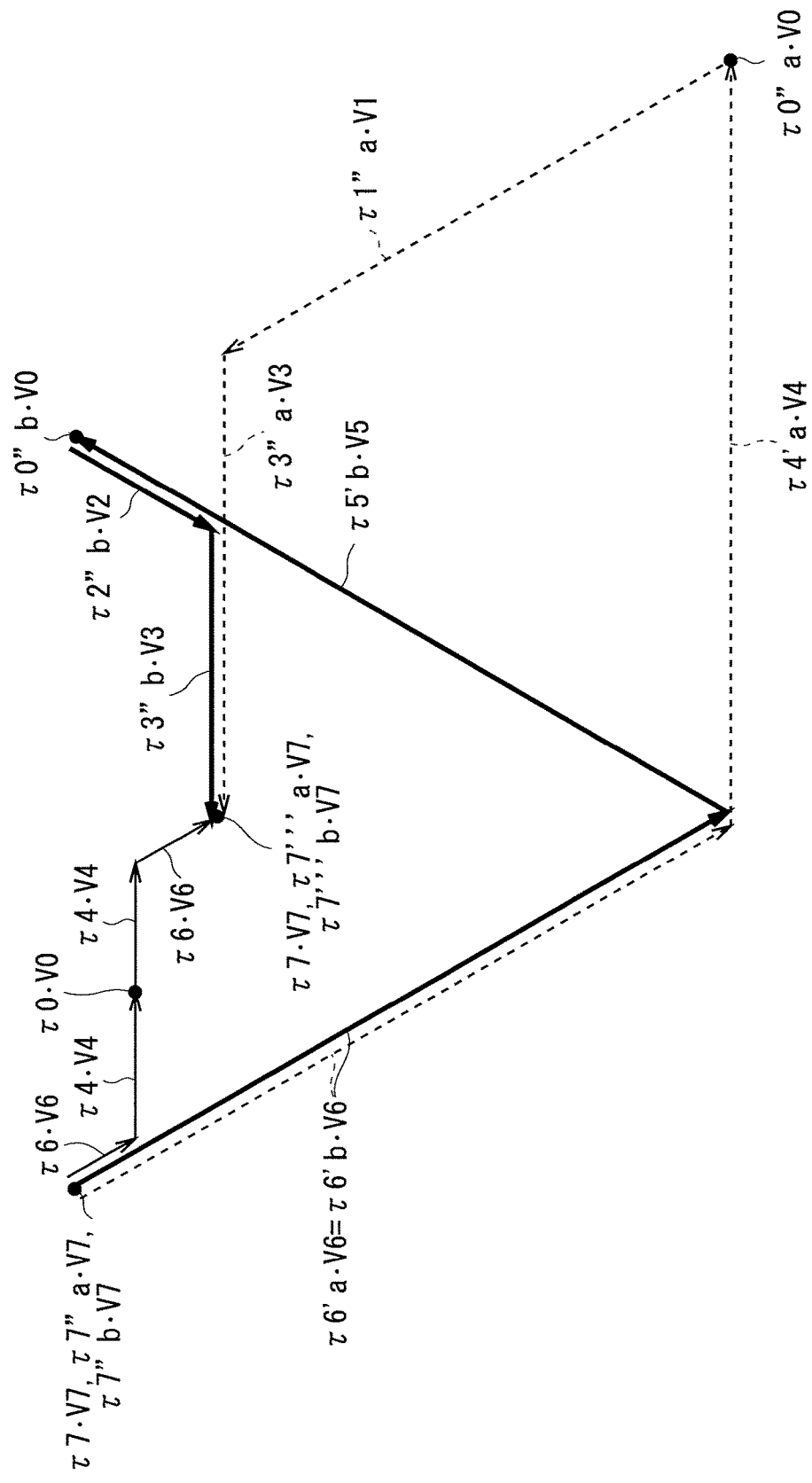
FIG. 39 is a vector diagram showing vector commands used in the second embodiment along with original vectors and the vector commands used in the first embodiment.

Besides, in the start time period and/or the end time period of the predetermined cycle T0, the zero voltage vector V7 can be used in place of the zero voltage vector V0 described so far. FIG. 39 is a vector diagram showing the vector commands in such a case, and shows the vector commands in the first embodiment in dashed lines and the vector commands in the second embodiment in solid lines (see the first matter in the "basic concepts").

As described above, the vector commands in the second embodiment, which reduce the magnetic flux deviation integral more than the vector commands in the first embodiment for reducing the number of switching times, can be grasped to satisfy the following conditions (I), (II), and (III) under the premise of the formula (19).

(I) The pair of correction vectors corresponds to a pair of the non-zero voltage vectors forming an angle of $2\pi/3$ in the complex plane;

(II) The pair of compensation vectors corresponds to a pair of the non-zero voltage vectors forming an angle of $\pi/3$ in the complex plane; and (III) The non-zero voltage vector corresponding to one of the pair of correction vectors that is used later and the non-zero voltage vector corresponding to one of the pair of compensation vectors that is used earlier form an angle of $\pi$ in the complex plane.

In a case where the condition (I) is examined for FIG. 32, the correction vectors τ4'b·V4 and τ2'b·V2 are used, which respectively correspond to the non-zero voltage vectors V4 and V2. With reference to FIG. 2, the non-zero voltage vectors V4 and V2 form an angle of $2\pi/3$ in the complex plane.

In a case where the condition (I) is examined for FIG. 39, the correction vectors τ6'b·V6 and τ5'b·V5 are used, which respectively correspond to the non-zero voltage vectors V6 and V5. With reference to FIG. 2, the non-zero voltage vectors V6 and V5 form an angle of 2π/3 in the complex plane.

In a case where the condition (II) is examined for FIG. 32, the compensation vectors τ5"b·V5 and τ1"b·V1 are used, which respectively correspond to the non-zero voltage vectors V5 and V1. With reference to FIG. 2, the non-zero voltage vectors V5 and V1 form an angle of π/3 in the complex plane.

In a case where the condition (II) is examined for FIG. 39, the compensation vectors τ2"b·V2 and τ3"b·V3 are used, which respectively correspond to the non-zero voltage vectors V2 and V3. With reference to FIG. 2, the non-zero voltage vectors V2 and V3 form an angle of π/3 in the complex plane.

In a case where the condition (III) is examined for FIG. 32, the correction vector used later is the correction vector τ2'b·V2, and the compensation vector used earlier is the compensation vector τ5"b·V5. These correspond to the non-zero voltage vectors V2 and V5, respectively. With reference to FIG. 2, the non-zero voltage vectors V2 and V5 form an angle of π in the complex plane.

In a case where the condition (III) is examined for FIG. 39, the correction vector used later is the correction vector τ5'b·V5, and the compensation vector used earlier is the compensation vector τ2"b·V2. These correspond to the non-zero voltage vectors V5 and V2, respectively, and form an angle of π in the complex plane.

Besides, from the perspective of reducing the deviation of the magnetic flux, it is desirable to satisfy the formula (21) (see description made on the formula (20)). Thus, in this case, the following conditions (IV) and (V) are added.

(IV) The pair of correction vectors each have a magnitude corresponding to the minimum time limit Tmin; and (V) One of the pair of the compensation vectors that is used later has a magnitude obtained by subtracting twice the sum of the magnitudes of the pair of original non-zero vectors from the minimum time limit Tmin.

The following condition (VI) is also added as a result of discussion made on the areas d4 and d5.

(VI) In the vector commands in one predetermined cycle T0, the no-value vector is not interposed between the pair of compensation vectors and the pair of correction vectors.

The condition (V) is, examined for FIG. 32, shown by the formula (29). The condition (V) is, examined for FIG. 39, shown by the following formula (36).

$$\tau 3''b = T\min - 2\tau 6 - 2\tau 4 \qquad (36)$$

As described above, when the conditions (I), (II), and (III) are satisfied, the magnetic flux deviation integral is smaller in the case where the vector commands in the second embodiment are used than in the case where the vector commands in the first embodiment are used throughout the predetermined cycle T0.

While the present disclosure has been described in detail, the foregoing description is in all aspects illustrative and not restrictive. It is therefore understood that numerous modifications that have not been described can be devised without departing from the scope of the present disclosure.

The invention claimed is:

1. A power converter controller for controlling a power converter every predetermined cycle, said power converter applying three-phase voltage to an inductive load to supply three-phase current to said inductive load, said power converter including three current paths each having a node and a pair of switches connected in series via said node between a pair of DC buses, said three-phase current being output from said three nodes according to conducting/non-conducting states of said three pairs of switches, said conducting/non-conducting states being based on a plurality of switching patterns, voltage vectors corresponding to said switching patterns being classified into a pair of zero voltage vectors and six non-zero voltage vectors other than said zero voltage vectors, a first one of said zero voltage vectors corresponding to a switching pattern in which said inductive load is connected to only a first one of said DC buses, a second one of said zero voltage vectors corresponding to a switching pattern in which said inductive load is connected to only a second one of said DC buses, said non-zero voltage vectors being shown with said zero voltage vectors as initial points to be located every angle of π/3 in a complex plane, each two of said non-zero voltage vectors that are located to form an angle of 2π/3 in said complex plane corresponding to said switching patterns that are common in one of said current paths and different in the other two of said current paths, each two of said non-zero voltage vectors that are located to form an angle of π in said complex plane corresponding to said switching patterns that are different in said three current paths, said power converter controller comprising:

a difference command generator that generates a difference command equivalent to a time integral of said three-phase voltage applied to said inductive load in one of said predetermined cycles in said complex plane;

a vector command generator that generates a plurality of vector commands that are respectively time integrals of said voltage vectors and compose said difference command;

a switching signal generator that generates switching signals for controlling said conducting/non-conducting states of said three pairs of switches on the basis of said vector commands; and a phase-current computing unit that detects current flowing through said DC buses to obtain an estimated value for said three-phase current on the basis of said current and said vector commands, wherein at least two of said vector commands that are time integrals of different ones of said non-zero voltage vectors have magnitudes greater than or equal to a predetermined value that corresponds to a minimum required amount of time to maintain said switching patterns in order for said phase-current computing unit to detect said current.

2. The power converter controller according to claim 1, wherein said vector command generator includes:

an original vector generator that generates original vectors every said predetermined cycle, the original vectors including a pair of original non-zero vectors;

a correction vector generator that generates a pair of correction vectors every said predetermined cycle;

a compensation vector generator that generates a pair of compensation vectors every said predetermined cycle; and a vector integrating unit that integrates said pair of said correction vectors, said pair of said compensation vectors, and at least one of no-value vectors to output said vector commands, wherein said pair of said original non-zero vectors are each a time integral of said non-zero voltage vector, form an angle of π/3 in said complex plane, and compose a half of said difference command, said pair of said correction vectors are each a time integral of said non-zero voltage vector, each have a magnitude greater than or equal to said predetermined value, and correspond to mutually different ones of said non-zero voltage vectors, one of said non-zero voltage vectors corresponding to one of said pair of said correction vectors and one of said non-zero voltage vectors corresponding to one of said original non-zero vectors matching each other, said pair of said compensation vectors are each a time integral of said non-zero voltage vector, correspond to mutually different ones of said non-zero voltage vectors, and compose said difference command along with said pair of said correction vectors, and said no-value vectors are each a time integral of said zero voltage vector, and have no magnitudes.

3. The power converter controller according to claim 2, wherein in said vector commands, said no-value vectors are used at a start time point and/or an end time point of said predetermined cycle, and in said vector commands, a difference between the number of switches conducting between said nodes and one of said DC buses in said switching patterns corresponding to said voltage vectors corresponding to said no-value vectors and the number of switches conducting between said nodes and said one of said DC buses in said switching patterns corresponding to said voltage vectors corresponding to said vector commands used immediately after said no-value vectors is one.

4. The power converter controller according to claim 3, wherein each of said non-zero voltage vectors corresponding to said correction vectors and each of said non-zero voltage vectors corresponding to said original non-zero vectors match each other, said pair of said compensation vectors form an angle of π/3 in said complex plane, a first one of said pair of said compensation vectors is used before a second one of said pair of said compensation vectors, when making a first number denote the number of switches conducting between said nodes and said one of said DC buses in one of said switching patterns corresponding to one of said voltage vectors corresponding to said first one of said compensation vectors, making a second number denote the number of switches conducting between said nodes and said one of said DC buses in one of said switching patterns corresponding to one of said voltage vectors corresponding to said second one of said compensation vectors, and making a third number denote the number of switches conducting between said nodes and said one of said DC buses in one of said switching patterns corresponding to one of said voltage vectors corresponding to one of said vector commands used immediately before said first one of said compensation vectors, said first number is greater than said second number in a case where said third number is three, said first number is smaller than said second number in a case where said third number is zero, and said first number is equal to said third number in a case where said third number is one or two.

5. The power converter controller according to claim 3, wherein in a case where the sum of magnitudes of said pair of said original non-zero vectors is smaller than or equal to a half of said predetermined value, said correction vectors correspond to a pair of said non-zero voltage vectors forming an angle of 2π/3 in said complex plane, said compensation vectors correspond to a pair of said non-zero voltage vectors forming an angle of π/3 in said complex plane, and one of said non-zero voltage vectors corresponding to one of said pair of said correction vectors used later and one of said non-zero voltage vectors corresponding to one of said pair of said compensation vectors used earlier form an angle of π in said complex plane.

6. The power converter controller according to claim 5, wherein said pair of said correction vectors each have a magnitude equal to said predetermined value, and one of said pair of said compensation vectors used later has a magnitude obtained by subtracting twice the sum of the magnitudes of said pair of said original non-zero vectors from said predetermined value.

7. The power converter controller according to claim 6, wherein in said vector commands in one of said predetermined cycles, said no-value vectors are not interposed between said pair of said compensation vectors and said pair of said correction vectors.

8. The power converter controller according to claim 2, wherein said original non-zero vectors each having a magnitude greater than or equal to said predetermined value are used as said correction vectors.

9. The power converter controller according to claim 3, wherein said original non-zero vectors each having a magnitude greater than or equal to said predetermined value are used as said correction vectors.

10. The power converter controller according to claim 4, wherein said original non-zero vectors each having a magnitude greater than or equal to said predetermined value are used as said correction vectors.

11. The power converter controller according to claim 5, wherein said original non-zero vectors each having a magnitude greater than or equal to said predetermined value are used as said correction vectors.

12. The power converter controller according to claim 6, wherein said original non-zero vectors each having a magnitude greater than or equal to said predetermined value are used as said correction vectors.

13. The power converter controller according to claim 7, wherein said original non-zero vectors each having a magnitude greater than or equal to said predetermined value are used as said correction vectors.

14. The power converter controller according to claim 3, wherein said original vectors are used at said start time point and said end time point of said predetermined cycle, and further include a pair of said no-value vectors that are equal to each other, and in said vector commands, one of said pair of said no-value vectors included in said original vectors is used at least at said start time point of said predetermined cycle.

15. The power converter controller according to claim 4, wherein said original vectors are used at said start time point and said end time point of said predetermined cycle, and further include a pair of said no-value vectors that are equal to each other, and in said vector commands, one of said pair of said no-value vectors included in said original vectors is used at least at said start time point of said predetermined cycle.

16. The power converter controller according to claim 5, wherein said original vectors are used at said start time point and said end time point of said predetermined cycle, and further include a pair of said no-value vectors that are equal to each other, and in said vector commands, one of said pair of said no-value vectors included in said original vectors is used at least at said start time point of said predetermined cycle.

17. The power converter controller according to claim 6, wherein said original vectors are used at said start time point and said end time point of said predetermined cycle, and further include a pair of said no-value vectors that are equal to each other, and in said vector commands, one of said pair of said no-value vectors included in said original vectors is used at least at said start time point of said predetermined cycle.

18. The power converter controller according to claim 7, wherein said original vectors are used at said start time point and said end time point of said predetermined cycle, and further include a pair of said no-value vectors that are equal to each other, and in said vector commands, one of said pair of said no-value vectors included in said original vectors is used at least at said start time point of said predetermined cycle.

* * * * *